(12) United States Patent
Park et al.

(10) Patent No.: US 11,387,430 B2
(45) Date of Patent: Jul. 12, 2022

(54) ORGANIC LIGHT EMITTING DISPLAY DEVICE INCLUDING WALL STRUCTURE SURROUNDING OPENING REGION

(71) Applicant: Samsung Display Co., Ltd., Yongin-Si (KR)

(72) Inventors: SangJin Park, Yongin-si (KR); Inkyung Yoo, Hwaseong-si (KR); Sung Bae Ju, Hwaseong-si (KR); Taehyeok Choi, Seoul (KR); Mijung Han, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 182 days.

(21) Appl. No.: 16/665,496

(22) Filed: Oct. 28, 2019

(65) Prior Publication Data
US 2020/0144539 A1 May 7, 2020

(30) Foreign Application Priority Data

Nov. 2, 2018 (KR) .......................... 10-2018-0133805

(51) Int. Cl.
*H01L 51/52* (2006.01)
*H01L 27/32* (2006.01)

(52) U.S. Cl.
CPC ...... *H01L 51/5253* (2013.01); *H01L 27/3234* (2013.01)

(58) Field of Classification Search
CPC ............. H01L 27/3227; H01L 27/3234; H01L 51/5253

USPC ........................................................ 257/288
See application file for complete search history.

(56) References Cited

U.S. PATENT DOCUMENTS

| 2017/0148856 | A1* | 5/2017 | Choi | ................ H01L 51/0096 |
| 2017/0162637 | A1* | 6/2017 | Choi | .................... G09G 3/20 |
| 2017/0237037 | A1* | 8/2017 | Choi | ..................... H01L 27/323 |
|  |  |  |  | 257/40 |
| 2017/0288004 | A1* | 10/2017 | Kim | ..................... H01L 51/0096 |
| 2020/0127231 | A1* | 4/2020 | Yun | ..................... H01L 27/3258 |
| 2020/0144535 | A1* | 5/2020 | Kim | ..................... H01L 51/5256 |

FOREIGN PATENT DOCUMENTS

| KR | 1020100023504 A | 3/2010 |
| KR | 1020140088737 A | 7/2014 |
| KR | 1020170059864 A | 5/2017 |

* cited by examiner

*Primary Examiner* — Matthew E. Gordon
(74) *Attorney, Agent, or Firm* — Cantor Colburn LLP

(57) ABSTRACT

An organic light emitting display device includes a display panel and an optical module. The display panel includes a substrate, a light emitting structure, and a first wall structure. The substrate has an opening region, a peripheral region surrounding the opening region, and a display region surrounding the peripheral region, where a first groove defined in the peripheral region and an opening is defined in the opening region. The light emitting structure is disposed in the display region on the substrate. The first wall structure is disposed within the first groove of the substrate. The optical module is disposed in the opening.

20 Claims, 19 Drawing Sheets

ORGANIC LIGHT EMITTING DISPLAY DEVICE INCLUDING WALL STRUCTURE SURROUNDING OPENING REGION

This application claims priority to Korean Patent Application No. 10-2018-0133805, filed on Nov. 2, 2018 and all the benefits accruing therefrom under 35 U.S.C. § 119, the content of which in its entirety is herein incorporated by reference.

BACKGROUND

1. Field

Exemplary embodiments generally relate to an organic light emitting display device. More particularly, embodiments of the invention relate to an organic light emitting display device including optical modules that are disposed in a portion of a display region.

2. Description of the Related Art

A flat panel display ("FPD") device is widely used as a display device of an electronic device because the FPD device is lightweight and thin compared to a cathode-ray tube ("CRT") display device. The FPD device typically includes a liquid crystal display ("LCD") device and an organic light emitting display ("OLED") device.

The OLED device may have a display region where an image is displayed and a non-display region in which gate drivers, data drivers, wirings, and optical modules (e.g., a camera module, a motion recognition sensor, etc.) are disposed. Recently, the OLED device where the optical module is disposed in an opening by forming the opening in a portion of the display region has been developed.

SUMMARY

In an organic light emitting display ("OLED") device where the optical module is disposed in an opening by forming the opening in a portion of the display region, block patterns blocking water, moisture, etc., capable of penetrating into the display region that is located adjacent to the optical module may be formed in an outer portion where the optical module is disposed. However, the blocking patterns may be easily damaged by an external impact or a stress in a manufacturing process. When the blocking patterns are damaged, a defect of a pixel included in the OLED device may occur.

Exemplary embodiments provide an OLED device including optical modules that are disposed in a portion of a display region.

According to an exemplary embodiment of the invention, an OLED device includes a display panel and an optical module. In such an embodiment, the display panel includes a substrate, a light emitting structure and a first wall structure. In such an embodiment, the substrate has an opening region, a peripheral region surrounding the opening region, and a display region surrounding the peripheral region, where a first groove is defined in the peripheral region and an opening is defined in the opening region. In such an embodiment, the light emitting structure is disposed in the display region on the substrate, the first wall structure is disposed within the first groove of the substrate, and the optical module is disposed in the opening.

In an exemplary embodiment, the first groove may include a first side wall located adjacent to the opening region and a second side wall opposing to the first side wall. In such an embodiment, the first wall structure may include a first wall pattern and a second wall pattern. In such an embodiment, the first wall pattern may be spaced apart from the first side wall and may surround the first side wall, and the second wall pattern may be spaced apart from the second side wall and may surround the first wall pattern.

In an exemplary embodiment, a distance of the first wall pattern from the first side wall may be identical to a distance of the second wall pattern from the second side wall.

In an exemplary embodiment, an upper surface of the first wall structure may be lower than an upper surface of the substrate.

In an exemplary embodiment, the substrate may include a first organic layer, a first barrier layer disposed on the first organic layer, a second organic layer disposed on the first barrier layer, and a second barrier layer disposed on the second organic layer. In such an embodiment, a first opening may be defined through the second organic layer in the peripheral region, and a second opening overlapping the first opening may be defined through the second barrier layer.

In an exemplary embodiment, the first opening and the second opening may collectively define the first groove of the substrate.

In an exemplary embodiment, the light emitting structure may include a lower electrode, a light emitting layer disposed on the lower electrode, and an upper electrode disposed on the light emitting layer.

In an exemplary embodiment, the upper electrode may extend from the display region into the peripheral region, and may be partially disposed in the peripheral region.

In an exemplary embodiment, the upper electrode may be separated in a space between the first wall structure and a side wall of the second organic layer defined by the first opening.

In an exemplary embodiment, the upper electrode within the first groove may be disposed on at least a portion of a side surface of the second organic layer, at least a portion of an upper surface of the first wall structure, a side surface, which is not opposite to the side surface of the second organic layer, of the first wall structure, and the first barrier layer.

In an exemplary embodiment, the first wall structure may have a first height from an upper surface of the first barrier layer to an upper surface of the first wall structure, and the second organic layer may have a second height from the upper surface of the first barrier layer to an upper surface of the second organic layer. The first height may be less than the second height.

In an exemplary embodiment, the first wall structure may be disposed on the first barrier layer, and may be spaced apart from a side wall of the second organic layer defined by the first opening. In such an embodiment, a distance of the first wall structure from the second organic layer may be defined as a first distance.

In an exemplary embodiment, the first distance may be greater than a thickness of the upper electrode.

In an exemplary embodiment, the OLED device may further include a thin film encapsulation structure disposed on the light emitting structure. In such an embodiment, the thin film encapsulation structure may include a first thin film encapsulation layer disposed on the upper electrode, a second thin film encapsulation layer disposed on the first thin film encapsulation layer, and a third thin film encapsulation layer disposed on the second thin film encapsulation layer. In such an embodiment, the first thin film encapsulation layer may include an inorganic material having flexibility, the second thin film encapsulation layer may include an organic material having flexibility, and the third thin film encapsulation layer may include an inorganic material having flexibility.

In an exemplary embodiment, the first thin film encapsulation layer and the third thin film encapsulation layer may extend in a direction from the display region into the peripheral region, and may be disposed in the peripheral region.

In other words, the first thin film encapsulation layer may be continuously disposed in a space between the first wall structure and a side wall of the second organic layer defined by the first opening.

In an exemplary embodiment, the first thin film encapsulation layer may be disposed inside a space between the first wall structure and the side wall of the second organic layer.

In an exemplary embodiment, the optical module may be in contact with a side surface of the substrate, a side surface of the upper electrode, a side surface of the first thin film encapsulation layer, and a side surface of the third thin film encapsulation layer in a boundary of the peripheral region and the opening region.

In an exemplary embodiment, the substrate may further include a second groove. In such an embodiment, the second groove may surround the first groove, and may be defined in the peripheral region.

In an exemplary embodiment, the display panel may further include a second wall structure disposed within the second groove of the substrate.

According to exemplary embodiments of the invention, the OLED device includes the wall structure disposed within the groove. The wall structure may be formed using the second organic layer, and may have a relatively large size. In such embodiments, the wall structure may be a relatively robust structure from an external impact or a stress in a manufacturing process. In such embodiments, since a size of the second opening of the second barrier layer is relatively increased, a photoresist used for forming the wall structure may be readily removed. That is, the first TFE layer and the third TFE layer may be readily disposed within the groove of the peripheral region. Accordingly, the OLED device may readily block that water, moisture, etc., is permeated into the semiconductor element and the light emitting structure.

BRIEF DESCRIPTION OF THE DRAWINGS

The above and other features of the invention will become more apparent by describing in detailed exemplary embodiments thereof with reference to the accompanying drawings, in which.

DETAILED DESCRIPTION

Figure 1:
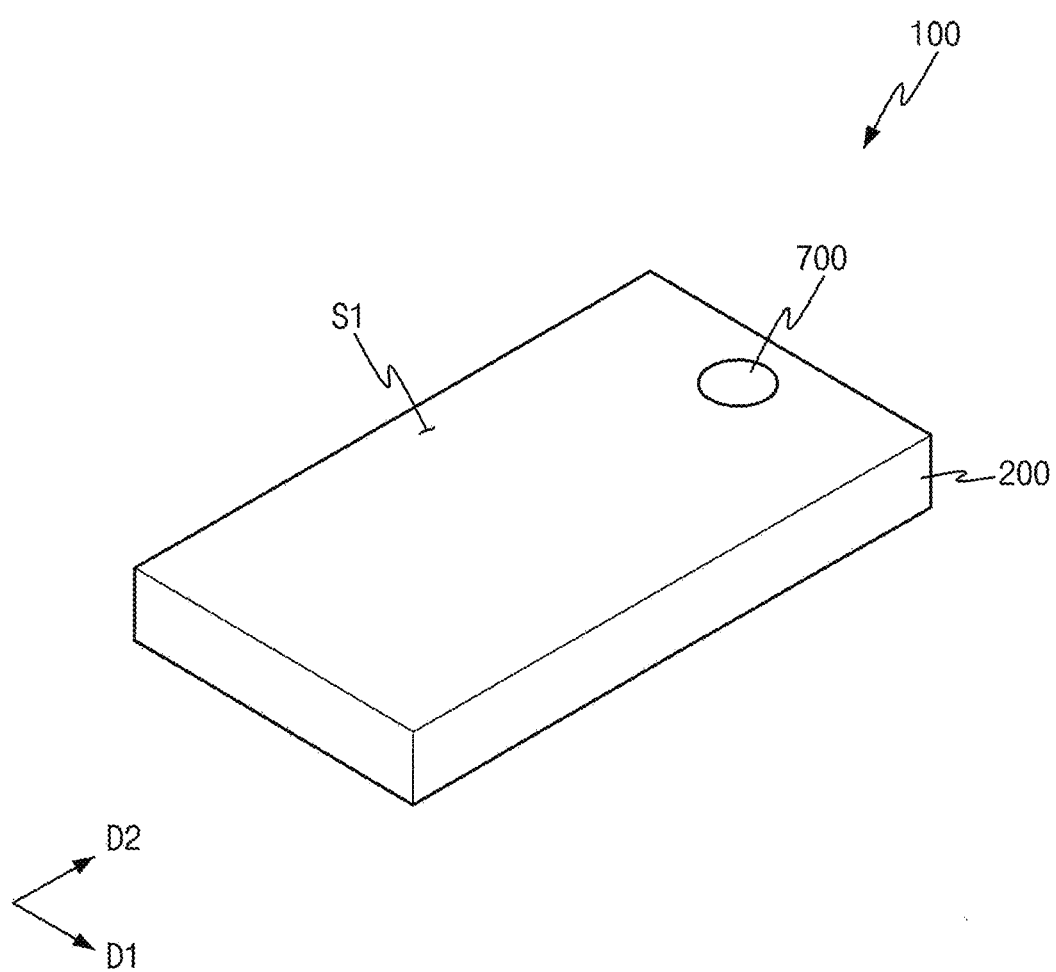
FIG. 1 is a perspective view illustrating an organic light emitting display ("OLED") device in accordance with an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "connected to" another element, it can be directly connected to the other element or intervening elements may be present therebetween. In contrast, when an element is referred to as being "directly connected to" another element, there are no intervening elements present.

It will be understood that, although the terms "first," "second," "third," etc. may be used herein to describe various elements, components, regions, sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. "At least one of A and B" means "A or B." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be explained in detail with reference to the accompanying drawings.

Figure 2:
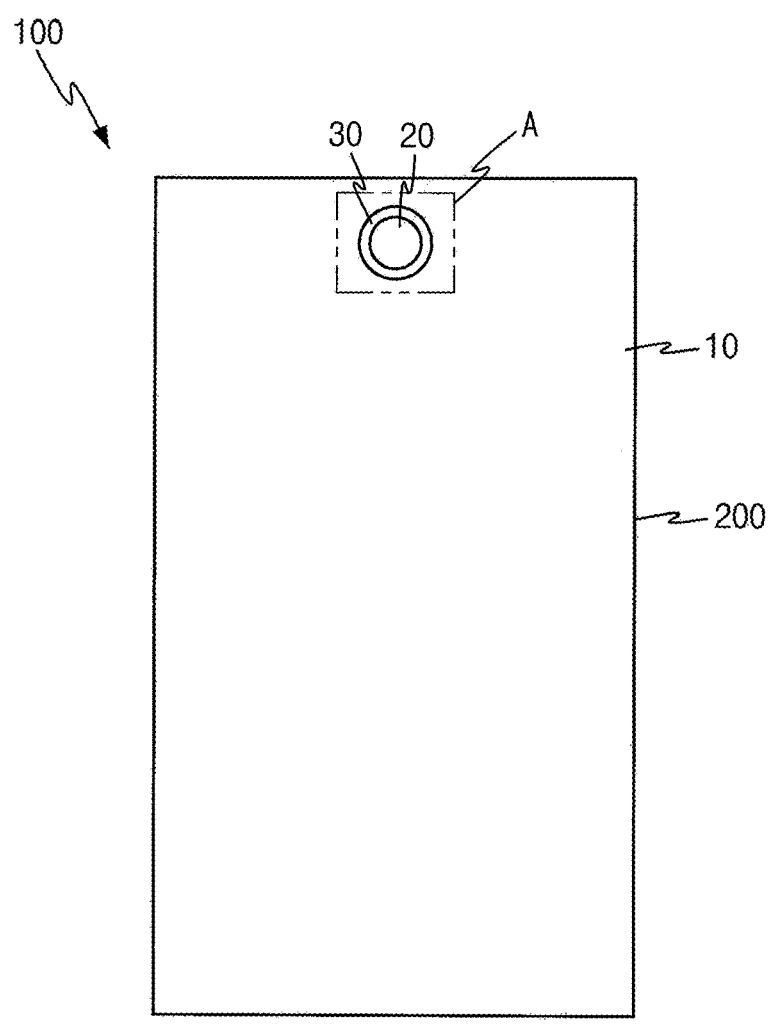
FIG. 2 is a plan view illustrating the OLED device of FIG. 1.
Figure 3:
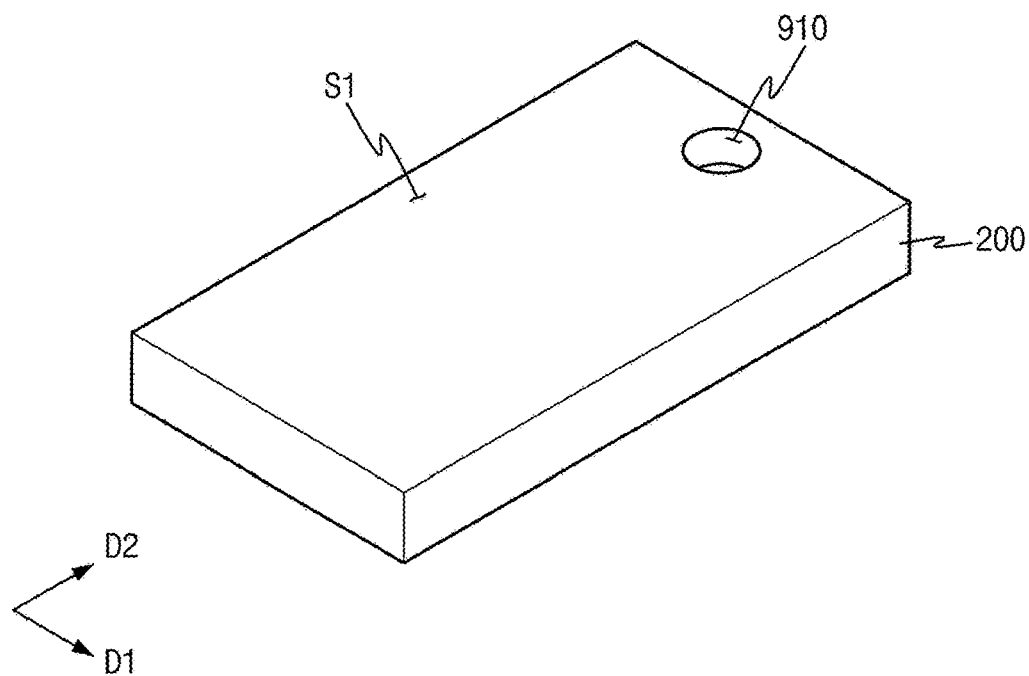
FIGS. 3 and 4 are perspective views for describing an opening defined in the OLED device of FIG. 1.
Figure 4:
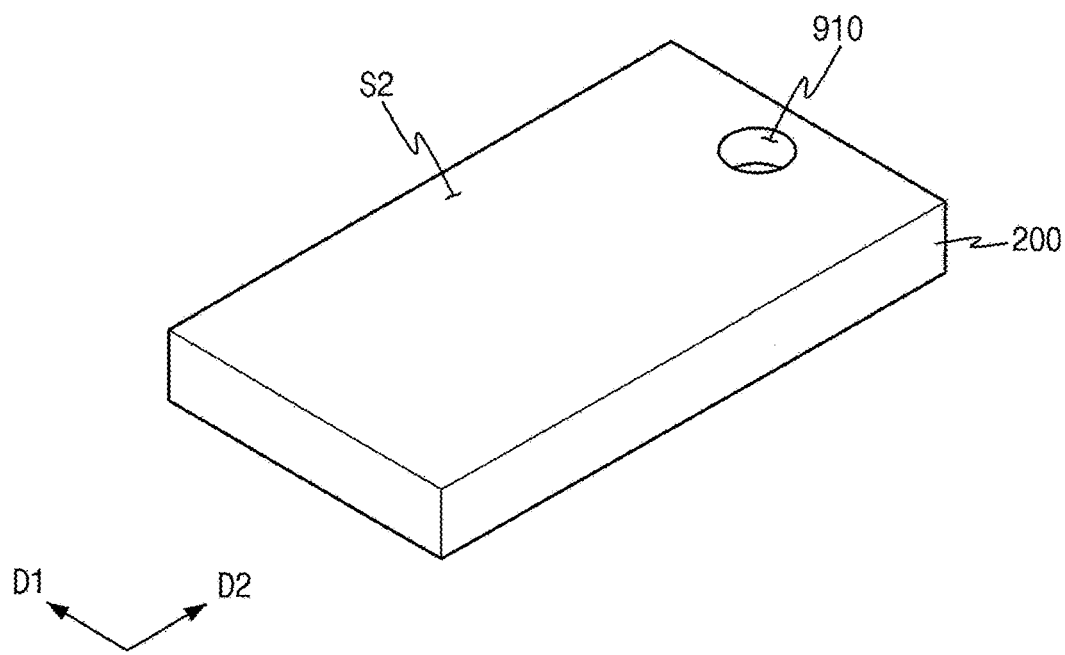

FIG. 1 is a perspective view illustrating an organic light emitting display ("OLED") device in accordance with an exemplary embodiment, and FIG. 2 is a plan view illustrating the OLED device of FIG. 1. FIGS. 3 and 4 are perspective views for describing an opening defined in the OLED device of FIG. 1.

Referring to FIGS. 1, 2, 3, and 4, an exemplary embodiment of an OLED device 100 may include a display panel 200 and an optical module 700, etc. The display panel 200 may have a first surface 51 and a second surface S2. Here, an image may be displayed through the first surface 51, and the second surface S2 may be opposite to the first surface 51. The optical module 700 may be disposed in a side of the display panel 200. The OLED device may have a short side extending in a first direction D1 and a long side extending in a second direction D2 crossing the first direction D1. The thickness direction of the OLED device 100 may be perpendicular to the first and second directions D1 and D2.

The display panel 200 may have a display region 10, an opening region 20, and a peripheral region 30. Here, the peripheral region 30 may surround the opening region 20, and the display region 10 may surround the peripheral region 30. Alternatively, the display region 10 might not completely surround the peripheral region 30. As illustrated in FIGS. 3 and 4, the display panel 200 may have an opening 910 defined in the opening region 20.

The display region 10 may include a plurality of sub-pixel regions (not shown). The sub-pixel regions may be arranged in the display region 10 substantially in a matrix form. A sub-pixel circuit (e.g., a semiconductor element 250 of FIG. 6) may be disposed in each of the sub-pixel regions of the display region 10, and an OLED (e.g., a light emitting structure 300 of FIG. 6) may be disposed on the sub-pixel circuit. Herein, OLED may also refer to an organic light emitting diode. An image may be displayed in the display region 10 through the sub-pixel circuit and the OLED.

In one exemplary embodiment, for example, first, second, and third sub-pixel circuits may be disposed in the sub-pixel regions, and first, second, and third OLEDs may be disposed on the first, second, and third sub-pixel circuits. The first sub-pixel circuit may be coupled to (or connected to) a first OLED capable of emitting a red color of light, and the second sub-pixel circuit may be coupled to a second OLED capable of emitting a green color of light. The third sub-pixel circuit may be coupled to the third OLED capable of emitting a blue color of light.

In an exemplary embodiment, the first OLED may be disposed to overlap the first sub-pixel circuit, and the second OLED may be disposed to overlap the second sub-pixel circuit. The third OLED may be disposed to overlap the third sub-pixel circuit. In an alternative exemplary embodiment, the first OLED may be disposed to overlap a portion of the first sub-pixel circuit and a portion of a sub-pixel circuit that is different from the first sub-pixel circuit, and the second OLED may be disposed to overlap a portion of the second sub-pixel circuit and a portion of a sub-pixel circuit that is different from the second sub-pixel circuit. In such an embodiment, the third OLED may be disposed to overlap a portion of the third sub-pixel circuit and a portion of a sub-pixel circuit that is different from the third sub-pixel circuit.

In such an embodiment, the first, second, and third OLEDs may be arranged using a RGB stripe method where tetragons of a same size are sequentially arranged, a s-stripe method including a blue OLED having a relatively large area, a WRGB method further including a white OLED, a Pen-tile method repeatedly arranged in an RG-GB pattern, etc.

In an exemplary embodiment, at least one driving transistor, at least one switching transistor, and at least one capacitor may be disposed in each of the sub-pixel regions.

In an exemplary embodiment, a shape of the display region 10 has a plan shape of a tetragon, but not being limited thereto. Alternative, the shape of the display region 10 may have a plan shape of a triangle, a plan shape of a diamond, a plan shape of a polygon, a plan shape of a circle, a plan shape of an athletic track or a plan shape of an elliptic, for example.

The optical module 700 may be disposed in the opening 910. In one exemplary embodiment, for example, the optical module 700 may include a camera module for capturing (or recognizing) an image of an object, a face recognition sensor module for sensing a face of a user, a pupil recognition sensor module for sensing a pupil of a user, acceleration and geomagnetic sensor modules for determining movement of the OLED device 100, proximity and infrared sensor modules for detecting proximity to the OLED device 100, or a light intensity sensor module for measuring the degree of brightness when left in a pocket or a bag, etc. In an exemplary embodiment, a functional module such as a vibration module for indicating an incoming alarm, a speaker module for outputting sound, etc., may be disposed in the opening 910.

In an exemplary embodiment, a shape of each of the opening region 20 and the peripheral region 30 has a plan shape of a circle, but not being limited thereto. Alternatively, the shape of each of the opening region 20 and the peripheral region 30 may have a plan shape of a triangle, a plan shape of a diamond, a plan shape of a polygon, a plan shape of a tetragon, a plan shape of an athletic track or a plan shape of an elliptic, for example.

Figure 5:
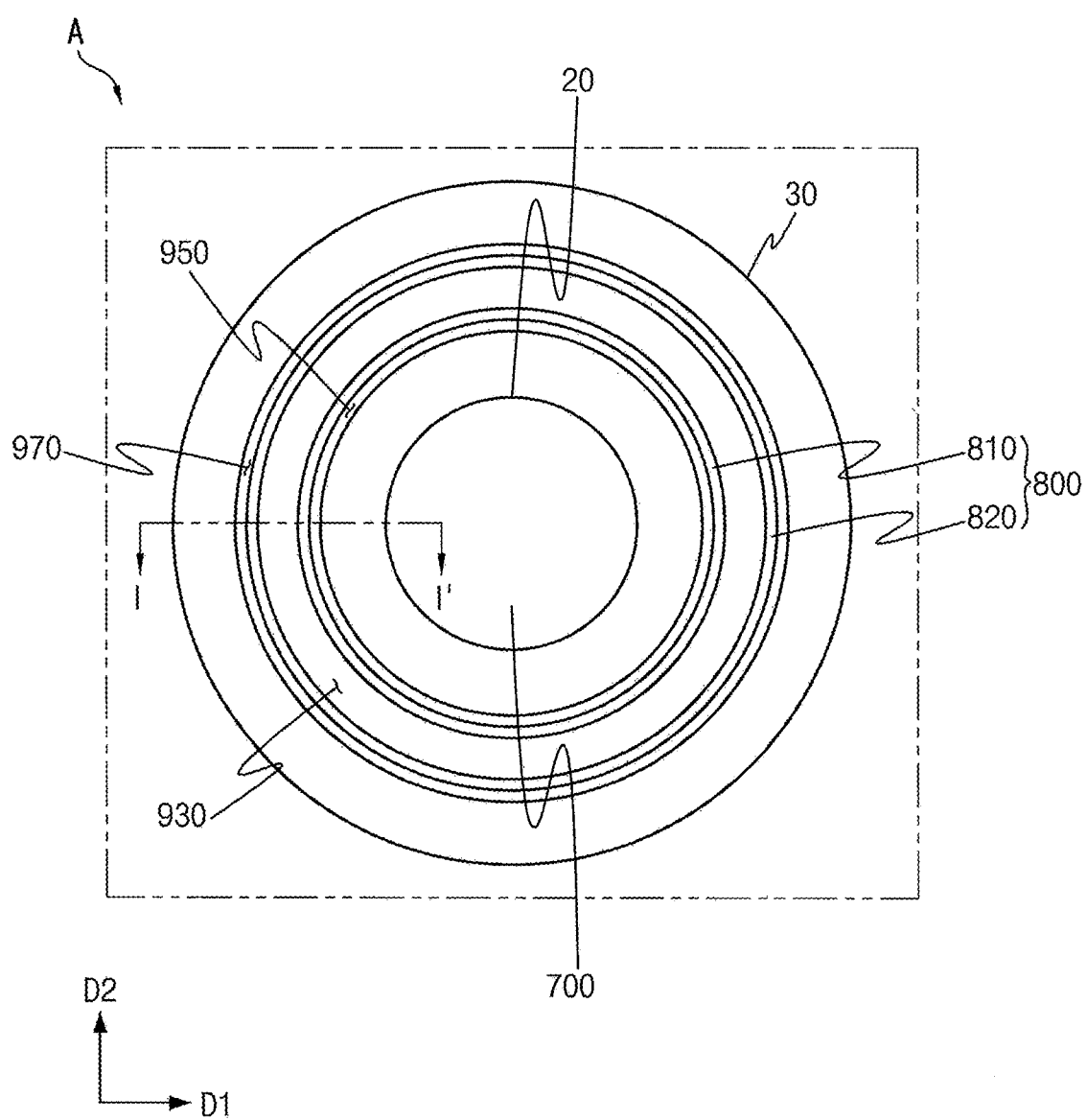
FIG. 5 is an enlarged plan view corresponding to region 'A' of FIG. 2.
Figure 6:
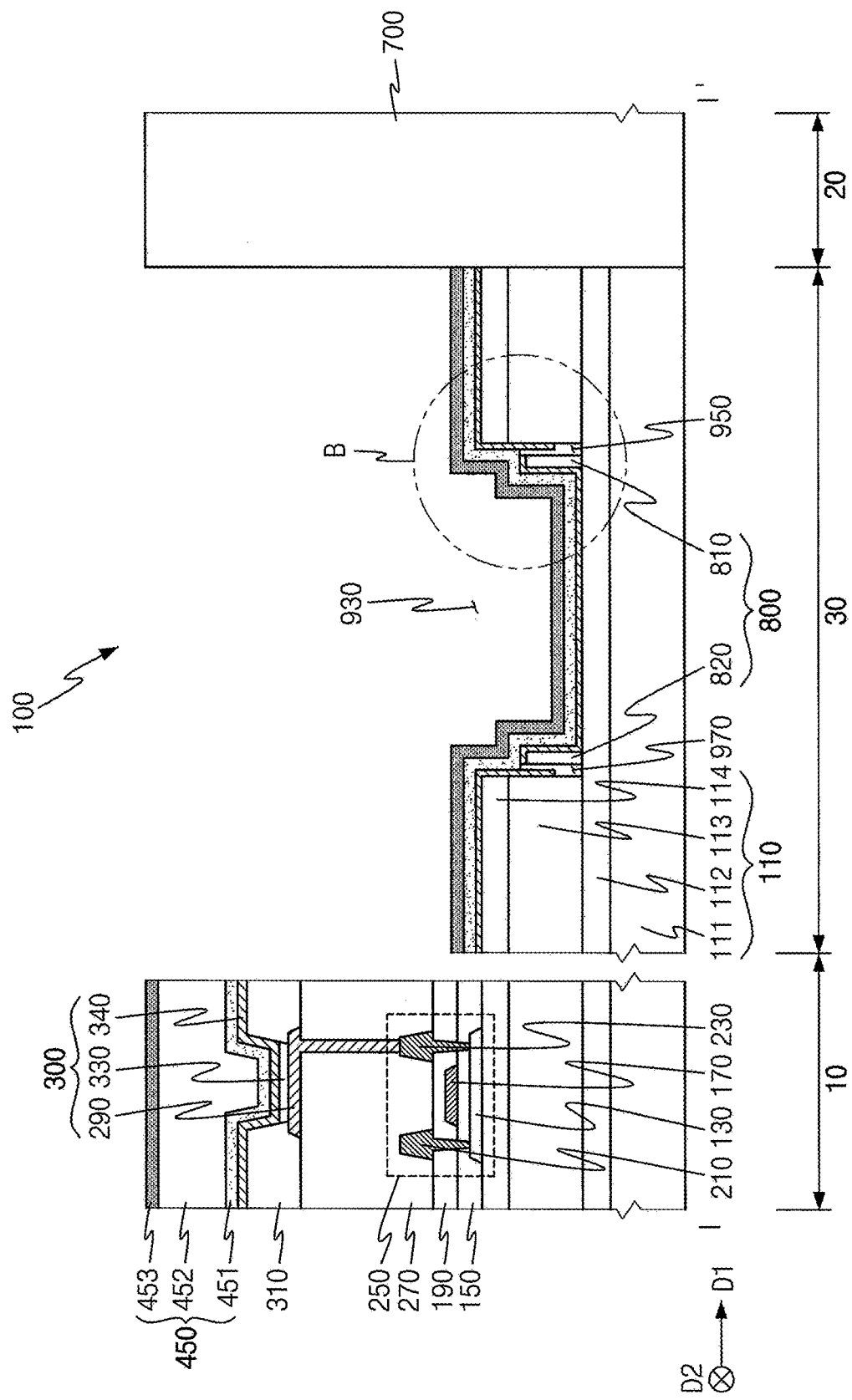
FIG. 6 is a cross-sectional view taken along line I-I' of FIG. 5.
Figure 7A:
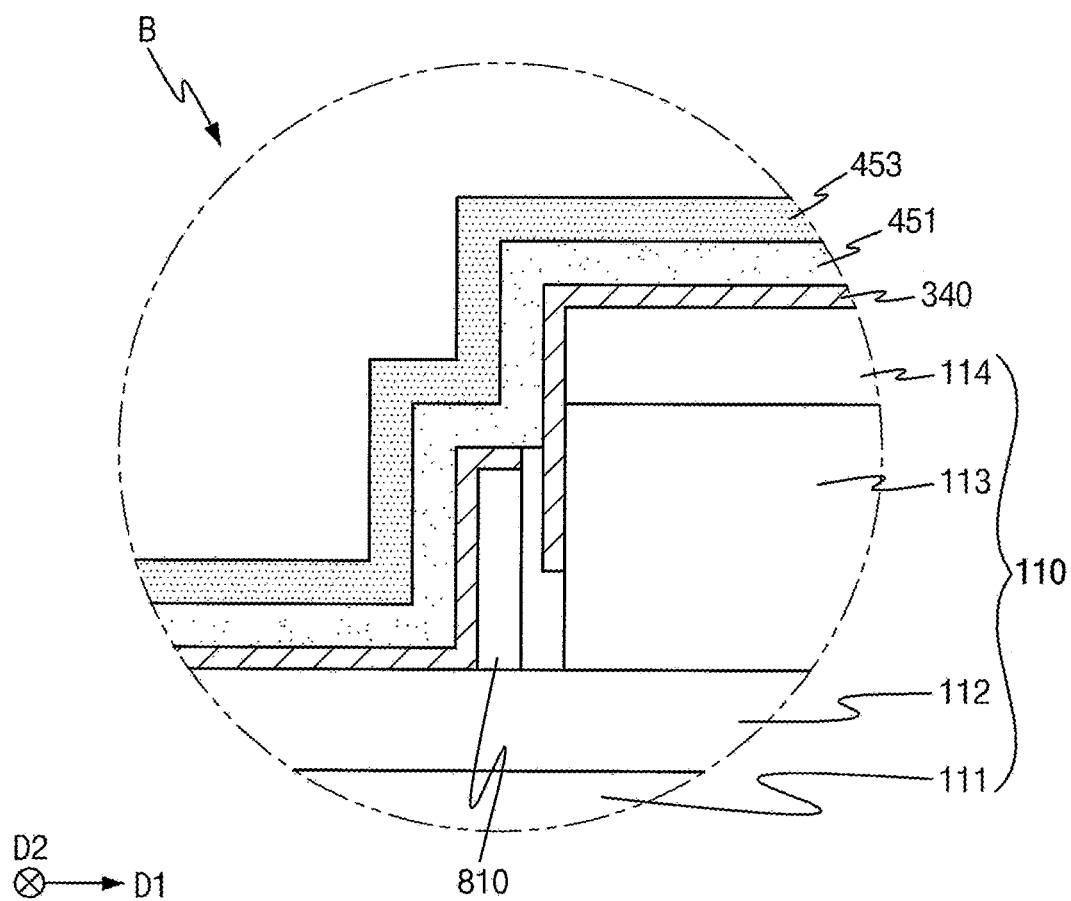
FIG. 7A is an enlarged plan view corresponding to region 'B' of FIG. 6.
Figure 7B:
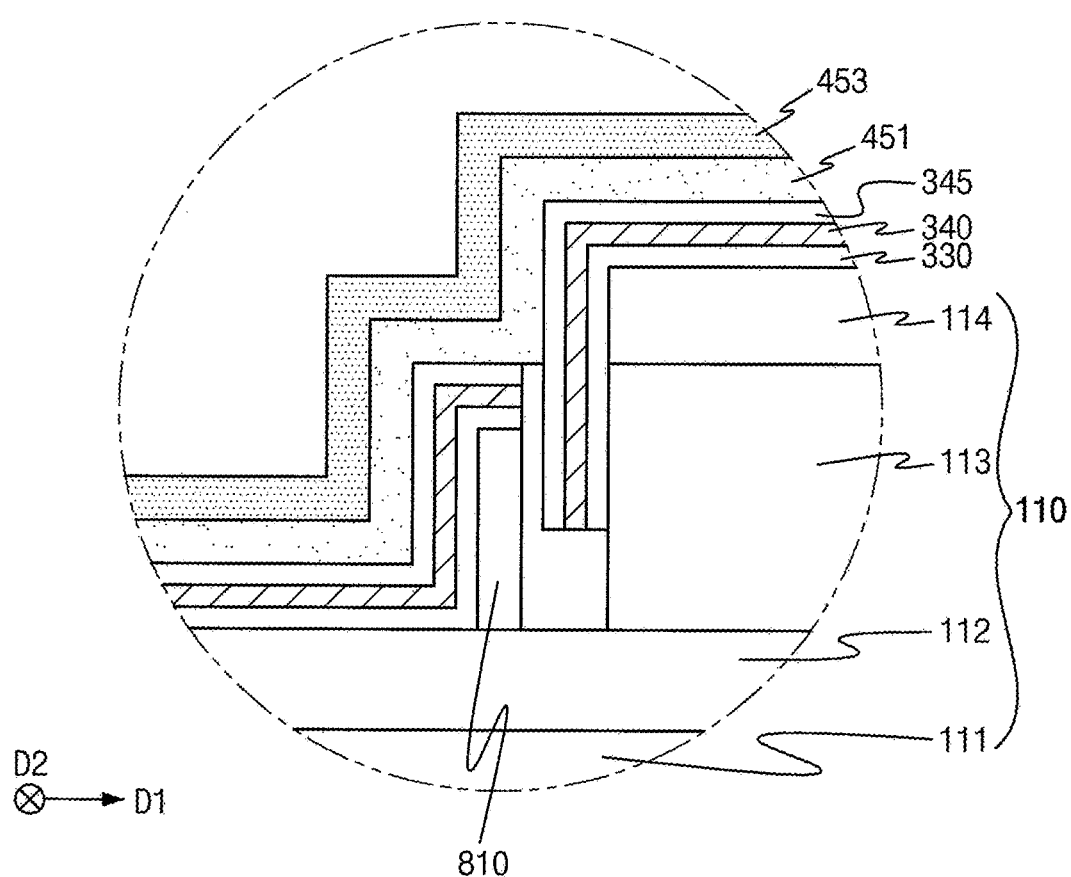
FIG. 7B is a partially enlarged plan view illustrating an exemplary embodiment of the OLED device corresponding to FIG. 6.
Figure 7C:
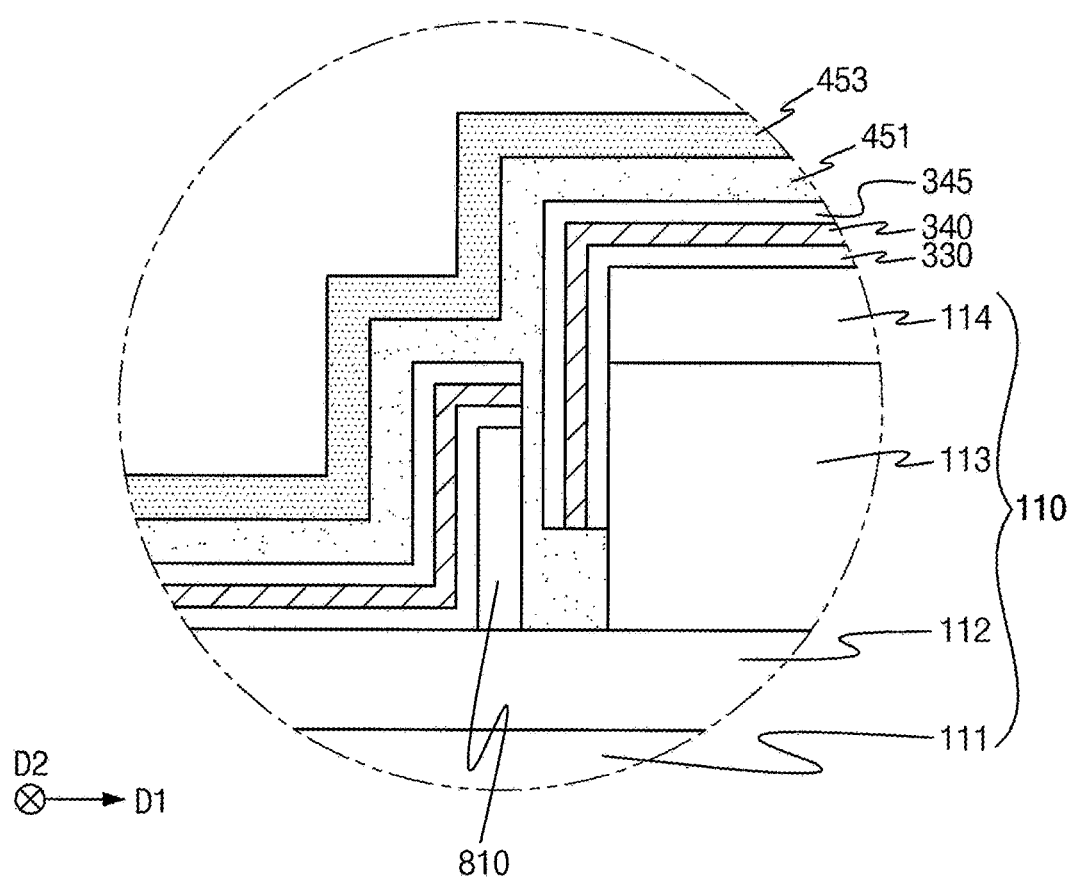
FIG. 7C is a partially enlarged plan view illustrating an alternative exemplary embodiment of the OLED device corresponding to FIG. 6.
Figure 8:
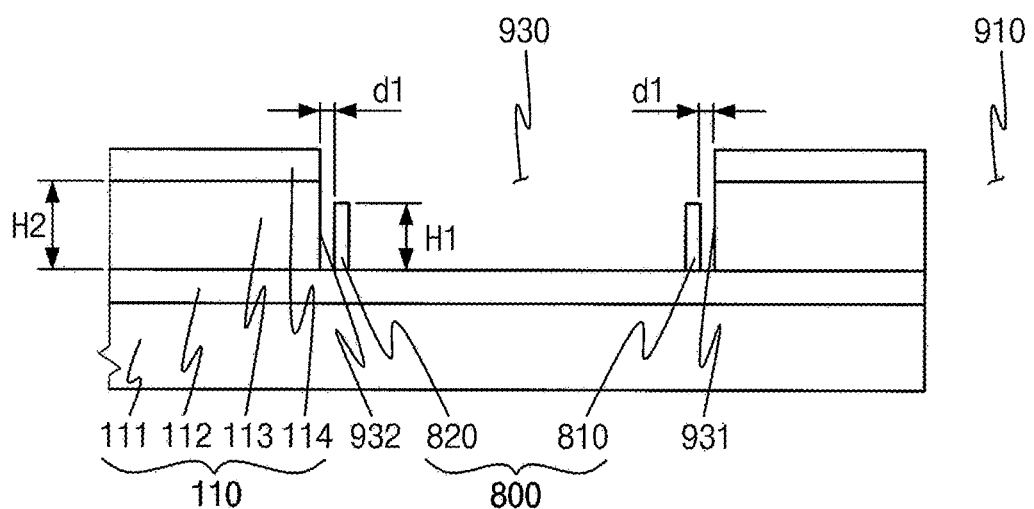
FIG. 8 is a cross-sectional view showing a wall structure of FIG. 6.

FIG. 5 is an enlarged plan view corresponding to region 'A' of FIG. 2, and FIG. 6 is a cross-sectional view taken along line I-I' of FIG. 5. FIG. 7A is an enlarged plan view corresponding to region 13' of FIG. 6, and FIG. 7B is a partially enlarged plan view illustrating an exemplary embodiment of the OLED device corresponding to FIG. 6. FIG. 7C is a partially enlarged plan view illustrating an alternative exemplary embodiment of the OLED device corresponding to FIG. 6, and FIG. 8 is a cross-sectional view showing a wall structure of FIG. 6.

Referring to FIGS. 5, 6, 7A, and 8, an exemplary embodiment of the display panel 200 may include a substrate 110, a semiconductor element 250, a planarization layer 270, a light emitting structure 300, a pixel defining layer 310, a thin film encapsulation ("TFE") structure 450, a wall structure 800, etc. In such an embodiment, the substrate 110 may include a first organic layer 111, a first barrier layer 112, a second organic layer 113, and a second barrier layer 114. In such an embodiment, where the display panel 200 has the display region 10, the opening region 20 and the peripheral region 30, the substrate 110 may be divided into the display region 10, the opening region 20 and the peripheral region 30. The semiconductor element 250 may include an active layer 130, a gate insulation layer 150, a gate electrode 170, an insulating interlayer 190, a source electrode 210 and a drain electrode 230, and the light emitting structure 300 may include a lower electrode 290, a light emitting layer 330 and an upper electrode 340. In such an embodiment, the TFE structure 450 may include a first TFE layer 451, a second TFE layer 452 and a third TFE layer 453, and the wall structure 800 may include a first wall pattern 810 and a second wall pattern 820.

In an exemplary embodiment, the display panel 200 may further include a groove 930 defined or formed in the peripheral region 30, and the wall structure 800 may be disposed within the groove 930. In such an embodiment, where the OLED device 100 includes the wall structure 800, the OLED device 100 may block that water, moisture, etc., is penetrated into the semiconductor element 250 and the light emitting structure 300.

In an exemplary embodiment, as described above, the substrate 110 includes the first organic layer 111. The first organic layer 111 may include an organic material having flexibility. In an exemplary embodiment, the first organic layer 111 may include a random copolymer or a block copolymer. In such an embodiment, the first organic layer 111 may have a high transparency, a low coefficient of thermal expansion, and a high glass transition temperature. In an exemplary embodiment, the first organic layer 111 includes an imide radical, such that a heat resistance, a chemical resistance, a wear resistance and electrical characteristics of the first organic layer 111 may be substantially high. In one exemplary embodiment, for example, the first organic layer 111 may include polyimide.

The first barrier layer 112 may be disposed on the entire first organic layer 111. The first barrier layer 112 may block moisture or water that is permeated through the first organic layer 111. The first barrier layer 112 may include an inorganic material having flexibility. In an exemplary embodiment, the first barrier layer 112 may include silicon oxide, silicon nitride, etc. In one exemplary embodiment, for example, the first barrier layer 112 may include silicon oxide (SiO), silicon nitride (SiN), silicon oxynitride (SiON), silicon oxycarbide (SiOC), silicon carbon nitride (SiCN), aluminum oxide (AlO), aluminum nitride (AlN), tantalum oxide (TaO), hafnium oxide (HfO), zirconium oxide (ZrO) or titanium oxide (TiO), etc.

The second organic layer 113 may be disposed on the first barrier layer 112. In an exemplary embodiment, the second organic layer 113 may have a first opening in the peripheral region 30. In one exemplary embodiment, for example, the first opening may expose an upper surface of the first barrier layer 112 located in the peripheral region 30. The second organic layer 113 may include an organic material having flexibility. In an exemplary embodiment, the second organic layer 113 may include a random copolymer or a block copolymer. In one exemplary embodiment, for example, the second organic layer 113 may include polyimide.

The second barrier layer 114 may be disposed on the second organic layer 113. The second barrier layer 114 may block moisture or water that is permeated through the second organic layer 113. In an exemplary embodiment, the second barrier layer 114 may have a second opening in the peripheral region 30, and the second opening may overlap the first opening. In one exemplary embodiment, for example, the second opening may expose the upper surface of the first barrier layer 112 located in the peripheral region 30. The second barrier layer 114 may include an inorganic material having flexibility. In an exemplary embodiment, the second barrier layer 114 may include SiO or SiN, for example.

In such an embodiment, the substrate 110 includes the first organic layer 111, the first barrier layer 112, the second organic layer 113 and the second barrier layer 114. In an exemplary embodiment, the first and second openings may define the groove 930 of the substrate 110 (or the display panel 200).

In an exemplary embodiment, the substrate 110 includes four layers, but not being limited thereto. In one exemplary embodiment, for example, the substrate 110 may include a single layer or at least two layers.

In an exemplary embodiment, the buffer layer (not shown) may be disposed on the substrate 110 (e.g., the second barrier layer 114). The buffer layer may be disposed on the entire substrate 110 except for the peripheral region 30. The buffer layer may effectively prevent the diffusion of metal atoms and/or impurities from the substrate 110 into the semiconductor element 250 and the light emitting structure 300. In such an embodiment, the buffer layer may control a rate of a heat transfer in a crystallization process for forming an active layer, thereby obtaining substantially uniform active layer. Further, the buffer layer may improve a surface flatness of the substrate 110 when a surface of the substrate 110 is relatively irregular. According to a type of the substrate 110, at least two buffer layers may be provided on the substrate 110, or the buffer layer may be omitted. In one exemplary embodiment, for example, the buffer layer may include an organic material or an inorganic material.

The active layer 130 may be disposed in the display region 10 on the substrate 110. The active layer 130 may include an oxide semiconductor, an inorganic semiconductor (e.g., amorphous silicon, polysilicon, etc.) or an organic semiconductor, etc.

The gate insulation layer 150 may be disposed on the active layer 130. The gate insulation layer 150 may cover the active layer 130 in the display region 10 on the substrate 110, and might not be disposed in the peripheral region 30. That is, the gate insulation layer 150 may be disposed only in the display region 10 on the substrate 110. In one exemplary embodiment, for example, the gate insulation layer 150 may sufficiently cover the active layer 130 on the substrate 110, and may have a substantially flat upper surface without a step around the active layer 130. Alternatively, the gate insulation layer 150 may cover the active layer 130 on the substrate 110, and may be disposed as a substantially uniform thickness along a profile of the active layer 130. The gate insulation layer 150 may include a silicon compound or a metal oxide, for example. Alternatively, the gate insulation layer 150 may have a multi-layered structure including a plurality of insulation layers. In one exemplary embodiment, for example, the insulation layers may have different thicknesses from each other or include different materials from each other.

The gate electrode 170 may be disposed in the display region 10 on the gate insulation layer 150. The gate electrode 170 may be disposed on a portion of the gate insulation layer 150 under which the active layer 130 is located. The gate electrode 170 may include a metal, a metal alloy, a metal nitride, a conductive metal oxide, a transparent conductive materials, etc. In one exemplary embodiment, for example, the gate electrode 170 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an alloy of aluminum, aluminum nitride (AlN), an alloy of silver, tungsten nitride (WN), an alloy of copper, an alloy of molybdenum, titanium nitride (TiN), chromium nitride (CrN), tantalum nitride (TaN), strontium ruthenium oxide (SRO), zinc oxide (ZnO), indium tin oxide ("ITO"), stannum oxide (SnO), indium oxide (InO), gallium oxide (GaO), indium zinc oxide ("IZO"), etc. These may be used alone or in a suitable combination thereof. Alternatively, the gate electrode 170 may have a multi-layered structure including a plurality of layers.

The insulating interlayer 190 may be disposed on the gate electrode 170. The insulating interlayer 190 may cover the gate electrode 170 in the display region 10 on the gate insulation layer 150, and might not be disposed in the peripheral region 30. That is, the insulating interlayer 190 may be disposed only in the display region 10 on the gate insulation layer 150. In one exemplary embodiment, for example, the insulating interlayer 190 may sufficiently cover the gate electrode 170 on the gate insulation layer 150, and may have a substantially flat upper surface without a step around the gate electrode 170. Alternatively, the insulating interlayer 190 may cover the gate electrode 170 on the gate insulation layer 150, and may be disposed as a substantially uniform thickness along a profile of the gate electrode 170. The insulating interlayer 190 may include silicon compound, metal oxide, etc. Alternatively, the insulating interlayer 190 may have a multi-layered structure including a plurality of insulation layers. The insulation layers may have different thicknesses from each other or include different materials from each other.

The source electrode 210 and the drain electrode 230 may be disposed in the display region 10 on the insulating interlayer 190. The source electrode 210 may be connected to a source region of the active layer 130 via a contact hole formed by removing a first portion of the gate insulation layer 150 and the insulating interlayer 190. The drain electrode 230 may be connected to a drain region of the active layer 130 via a contact hole formed by removing a second portion of the gate insulation layer 150 and the insulating interlayer 190. Each of the source electrode 210 and the drain electrode 230 may include a metal, an alloy, a metal nitride, a conductive metal oxide, a transparent conductive material, etc. Such materials may be used alone or in a suitable combination thereof. In an exemplary embodiment, each of the source and drain electrodes 210 and 230 may have a multi-layered structure including a plurality of layers. Accordingly, the semiconductor element 250 including the active layer 130, the gate insulation layer 150, the gate electrode 170, the insulating interlayer 190, the source electrode 210, and the drain electrode 230 may be disposed.

In an exemplary embodiment, the semiconductor element 250 has a top gate structure, but not being limited thereto. In an alternative exemplary embodiment, the semiconductor element 250 may have a bottom gate structure.

In an exemplary embodiment, the display panel 200 includes one semiconductor element, but not being limited thereto. In an alternative exemplary embodiment, the display panel 200 may include at least one semiconductor element and at least one capacitor.

The planarization layer 270 may be disposed on the insulating interlayer 190, the source electrode 210, and the drain electrode 230. The planarization layer 270 may cover the source and drain electrodes 210 and 230 in the display region 10 on the insulating interlayer 190, and might not be disposed in the peripheral region 30. That is, the planarization layer 270 may be disposed only in the display region 10 on the insulating interlayer 190. In one exemplary embodiment, for example, the planarization layer 270 may be disposed as a high thickness in the display region 10. In this case, the planarization layer 270 may have a substantially flat upper surface, and a planarization process may be further performed on the planarization layer 270 to implement the flat upper surface of the planarization layer 270. Alternatively, the planarization layer 270 may be disposed as a substantially uniform thickness along a profile of the source and drain electrodes 210 and 230 in the display region 10 on the insulating interlayer 190. The planarization layer 270 may include organic materials or inorganic materials. In an exemplary embodiment, the planarization layer 270 may include organic materials.

The lower electrode 290 may be disposed in the display region 10 on the planarization layer 270. The lower electrode 290 may be connected to the drain electrode 230 via a contact hole formed by removing a portion of the planarization layer 270. In addition, the lower electrode 290 may be electrically connected to the semiconductor element 250. The lower electrode 290 may include a metal, a metal alloy, a metal nitride, a conductive metal oxide or a transparent conductive material, for example. Such materials may be used alone or in a suitable combination thereof. In an exemplary embodiment, the lower electrode 290 may have a multi-layered structure including a plurality of layers.

In an exemplary embodiment, the wall structure 800 may be disposed in the peripheral region 30 on the first barrier layer 112. The wall structure 800 may be disposed along a profile of an outer portion of the opening region 20. In such an embodiment, the wall structure 800 may surround the optical module 700. In such an embodiment, the wall structure 800 may be disposed within the groove 930 of the substrate 110. Here, the groove 930 may include a first side wall 931 located adjacent to the opening region 20 and a second side wall 932 located opposite to (or facing) the first side wall 931 (refer to FIG. 8). In one exemplary embodiment, for example, the first side wall 931 may be defined as a first side wall of the first opening of the second organic layer 113 (or the second opening of the second barrier layer 114), and the second side wall 932 may be defined as a second side wall, which is opposite to the first side wall, of the first opening of the second organic layer 113.

In an exemplary embodiment, as illustrated in FIGS. 5, 6, and 8, the wall structure 800 may include the first wall pattern 810 and the second wall pattern 820. Each of the first wall pattern 810 and the second wall pattern 820 may have a plan shape of a hollow circle. The first wall pattern 810 may be spaced apart from the first side wall 931 by a first distance dl, and may substantially surround the first side wall 931. Here, a space where the first wall pattern 810 is spaced apart from the first side wall 931 by the first distance dl may be defined as a first space 950. The second wall pattern 820 may be spaced apart from the second side wall 932 by the first distance dl, and may substantially surround the first wall pattern 810. Here, a space where the second wall pattern 820 is spaced apart from the second side wall 932 by the first distance dl may be defined as a second space 970. In one exemplary embodiment, for example, the first distance dl where the first wall pattern 810 is spaced apart from the first side wall 931 may be substantially identical to a distance where the second wall pattern 820 is spaced apart from the second side wall 932, and the first distance dl may be greater than a thickness of the upper electrode 340. In such an embodiment, if the first distance dl is less than a thickness of the upper electrode 340, the upper electrode 340 may not be disconnected or separated in the first space 950 and the second space 970. In other words, the upper electrode 340 may be integrally formed in the peripheral region 30. In this case, the integrally formed upper electrode 340 may be used as a permeability path of water and/or moisture. Thus, in such an embodiment, the first distance dl is greater than the thickness of the upper electrode 340. In an exemplary embodiment, a diameter of the second wall pattern 820 may be greater than a diameter of the first wall pattern 810 when viewed from a plan view in the thickness direction of the substrate 110 or the OLED device. Further, an upper surface of the wall structure 800 may be located lower than an upper surface of the substrate 110 (or an upper surface of the second organic layer 113). The wall structure 800 may have a first height H1 from an upper surface of the first barrier layer 112 to an upper surface of the wall structure 800, and the second organic layer 113 may have a second height H2 from an upper surface of the first barrier layer 112 to an upper surface of the second organic layer 113. The first height H1 may be less than the second height H2. In such an embodiment, if the first height H1 is identical to or greater than the second height H2, the upper electrode 340 may not be separated in the first space 950 and the second space 970. In other words, the upper electrode 340 may be integrally formed in the peripheral region 30. In this case, the integrally formed upper electrode 340 may be used as a permeability path of water and/or moisture. Thus, in an exemplary embodiment, the first height H1 may be determined to be less than the second height H2 such that the upper electrode 340 is disconnected or separated in the first space 950 and the second space 970.

The wall structure 800 may include an inorganic material or an organic material. In an exemplary embodiment, the wall structure 800 may include an organic material. In one exemplary embodiment, for example, the wall structure 800 may include a photoresist, a polyacryl-based resin, a polyimide-based resin, a polyamide-based resin, a siloxane-based resin, an acryl-based resin or an epoxy-based resin, for example.

The pixel defining layer 310 may be disposed in the display region 10 on the planarization layer 270, and may not be disposed in the peripheral region 30. In an exemplary embodiment, the pixel defining layer 310 may be disposed only in the display region 10. In one exemplary embodiment, for example, the pixel defining layer 310 may cover both lateral portions of the lower electrode 290, and may expose a portion of an upper surface of the lower electrode 290. The pixel defining layer 310 may include an organic material or an inorganic material. In one exemplary embodiment, for example, the pixel defining layer 310 may include an organic material.

The light emitting layer 330 may be disposed on a portion of the lower electrode 290 exposed by the pixel defining layer 310 in the display region 10. The light emitting layer 330 may be formed using at least one of light emitting materials capable of generating different colors of light (e.g., a red color of light, a blue color of light, and a green color of light, etc.) according to sub-pixels. Alternatively, the light emitting layer 330 may generally generate a white color of light by stacking a plurality of light emitting materials capable of generating different colors of light such as a red color of light, a green color of light, a blue color of light, etc. In such an embodiment, a color filter may be disposed on the light emitting layer 330. The color filter may include a red color filter, a green color filter and a blue color filter. Alternatively, the color filter may include a yellow color filter, a cyan color filter and a magenta color filter. The color filter may include a photosensitive resin or a color photoresist, for example.

In an exemplary embodiment, as illustrated in FIG. 7B, the light emitting layer 330 may be disposed in the peripheral region 30. In a conventional OLED device, when the light emitting layer 330 is disposed in the peripheral region 30, the light emitting layer 330 disposed under the upper electrode 340 of the peripheral region 30 may be used as a permeability path of water and/or moisture. In this case, the semiconductor element 250 and the light emitting structure 300 disposed in the display region 10 located adjacent to the peripheral region 30 may be damaged by the water and/or moisture. In an exemplary embodiment of the invention, as described above, the display panel 200 includes the first wall pattern 810 spaced apart from the first side wall 931 and the second wall pattern 820 spaced apart from the second side wall 932, such that the light emitting layer 330 may be disconnected or separated in the first space 950 and the second space 970. In such an embodiment, as the light emitting layer 330 is separated in the first space 950 and the second space 970, the permeability path of the light emitting layer 330 may be effectively blocked. Accordingly, although the light emitting layer 330 is disposed in the peripheral region 30, a defect of a pixel included in the OLED device 100 may not occur. In an exemplary embodiment, where the light emitting layer 330 is disposed under the upper electrode 340, the first distance dl may be relatively increased such that each of the light emitting layer 330 and the upper electrode 340 is separated in the first space 950 and the second space 970.

Referring to FIGS. 5, 6, 7A and 8, the upper electrode 340 may be disposed in the display region 10 and a portion of the peripheral region 30 on the pixel defining layer 310 and the light emitting layer 330. In an exemplary embodiment, the upper electrode 340 may extend in the first direction D1 from the display region 10 into the peripheral region 30, and may be partially disposed in the peripheral region 30. In one exemplary embodiment, for example, the upper electrode 340 may be separated in the first space 950 where the first wall pattern 810 is spaced apart from the first side wall of the second organic layer 113 (e.g., the first side wall 931) defined by the first opening of the second organic layer 113, and may be separated in the second space 970 where the second wall pattern 820 is spaced apart from the second side wall of the second organic layer 113 (e.g., second side wall 932) defined by the first opening of the second organic layer 113. In such an embodiment, the upper electrode 340 within the groove 930 may be disposed on both lateral side surfaces of the second barrier layer 114, at least a portion of both lateral side surfaces of the second organic layer 113 each, at least a portion of an upper surface of the wall structure 800, inner side surfaces, which is not opposite to both lateral side surfaces of the second organic layer 113, of the wall structure 800 (e.g., side surfaces facing the first wall pattern 810 and the second wall pattern 820), and the first barrier layer 112. In an exemplary embodiment, as the display panel 200 includes the first wall pattern 810 spaced apart from the first side wall 931 and the second wall pattern 820 spaces apart from the second side wall 932, the upper electrode 340 may be separated in the first space 950 and the second space 970, and the upper electrode 340 may not be used as the permeability path of the water and/or moisture because the upper electrode 340 is separated. The upper electrode 340 may include a metal, a metal alloy, a metal nitride, a conductive metal oxide or a transparent conductive material, for example. Such materials may be used alone or in a suitable combination thereof. In an exemplary embodiment, the upper electrode 340 may have a multi-layered structure including a plurality of layers. Accordingly, the light emitting structure 300 including the lower electrode 290, the light emitting layer 330, and the upper electrode 340 may be disposed.

In an exemplary embodiment, as illustrated in FIG. 7B, a capping layer 345 may be disposed on the upper electrode 340. In such an embodiment, the capping layer 345 may be disposed in the peripheral region 30. In a conventional OLED device, when the capping layer 345 is disposed in the peripheral region 30, the capping layer 345 disposed on the upper electrode 340 of the peripheral region 30 may be used as a permeability path of water and/or moisture. In this case, the semiconductor element 250 and the light emitting structure 300 disposed in the display region 10 located adjacent to the peripheral region 30 may be damaged by the water and/or moisture. In an exemplary embodiment of the invention, since the display panel 200 includes the first wall pattern 810 spaced apart from the first side wall 931 and the second wall pattern 820 spaced apart from the second side wall 932, the capping layer 345 may be separated in the first space 950 and the second space 970. In such an embodiment, as the capping layer 345 is separated in the first space 950 and the second space 970, the permeability path of the capping layer 345 may be blocked. Accordingly, although the capping layer 345 is disposed in the peripheral region 30, a defect of a pixel included in the OLED device 100 might not occur. However, when the capping layer 345 is disposed on the upper electrode 340, the first distance d1 may be relatively increased such that each of the capping layer 345 and the upper electrode 340 is separated in the first space 950 and the second space 970. The capping layer 345 may protect the light emitting structure 300, and may include an organic material or an inorganic material. In one exemplary embodiment, for example, the capping layer 345 may include a triamine derivative, an arylenediamine derivative, 4,4'-N,N'-dicarbazole-biphenyl ("CBP"), or tris(8-hydroxyquinolate)aluminium ("Alq3"), for example.

Referring to FIGS. 5, 6, 7A and 8, the first TFE layer 451 may be disposed in the display region 10 and the peripheral region 30 on the upper electrode 340. The first TFE layer 451 may cover the upper electrode 340 in the display region 10, and may be disposed as a substantially uniform thickness along a profile of the upper electrode 340 and extend in the peripheral region 30. The first TFE layer 451 may be disposed along a profile of the upper electrode 340 in the peripheral region 30. The first TFE layer 451 may effectively prevent the light emitting structure 300 from being deteriorated by the permeation of moisture, water, oxygen, etc. In addition, the first TFE layer 451 may protect the light emitting structure 300 from external impacts. The first TFE layer 451 may include an inorganic material having flexibility.

In an exemplary embodiment, as illustrated in FIG. 7C, the first TFE layer 451 may be disposed in the first space 950 and the second space 970. In such an embodiment, as the first TFE layer 451 disposed in the first space 950 and the second space 970 may support the first wall pattern 810 and the second wall pattern 820, the first TFE layer 451 may effectively prevent the wall structure 800 from being separated from the first barrier layer 112.

Referring to FIGS. 5, 6, 7A and 8, the second TFE layer 452 may be disposed in the display region 10 on the first TFE layer 451, and may not be disposed in the peripheral region 30. In such an embodiment, the second TFE layer 452 may be disposed only in the display region 10. The second TFE layer 452 may improve the flatness of the display panel 200, and may protect the light emitting structure 300. The second TFE layer 452 may include an organic material having flexibility.

The third TFE layer 453 may be disposed in the display region 10 and the peripheral region 30 on the second TFE layer 452. The third TFE layer 453 may cover the second TFE layer 452 in the display region 10 and be disposed as a substantially uniform thickness along a profile of the second TFE layer 452, and may extend in the peripheral region 30. The third TFE layer 453 may cover the first TFE layer 451 in the peripheral region 30, and may be disposed as a substantially uniform thickness along a profile of the first TFE layer 451. The third TFE layer 453 together with the first TFE layer 451 may effectively prevent the light emitting structure 300 from being deteriorated by the permeation of moisture, water, oxygen, etc. In addition, the third TFE layer 453 together with the first and second TFE layers 451 and 452 may protect the light emitting structure 300 from external impacts. The third TFE layer 453 may include an inorganic material having flexibility. Accordingly, the TFE structure 450 including the first TFE layer 451, the second TFE layer 452, and the third TFE layer 453 may be disposed. Alternatively, the TFE structure 450 may have five layers structure where first to fifth TFE layers are stacked one on another or seven layers structure where first to seventh TFE layers are stacked one on another.

As a conventional OLED device has an opening having an enlarged lower portion in a groove region, an upper electrode 340 may be separated in a peripheral region 30. In such a conventional OLED device, the opening having an enlarged lower portion may have an under-cut shape, and a second organic layer 113 having an opening of a first width and a second barrier layer 114 having an opening of a second width may be formed in the peripheral region 30. Here, the first width may be greater than the second width, and first opening may overlap the second opening. The second barrier layer 114 located adjacent to the second opening may be defined as a tip, and the upper electrode 340 may be separated in the peripheral region 30 through the tip. However, the tip may be easily damaged by external impacts or a stress in a manufacturing process (e.g., a removal of top and/or bottom protection films, etc.), and a defect of a pixel included in the conventional OLED device may occur when the tip is damaged. In addition, a residue of a photoresist used for patterning a metal layer, etc., might not be completely removed within the opening having an enlarged lower portion, and a layer separation phenomenon may be generated when a first TFE layer 451 is formed. Further, a defect of the conventional OLED device may occur in a subsequent process due to the residue of the photoresist.

An exemplary embodiment of the OLED device 100 includes the wall structure 800 disposed within the groove 930. The wall structure 800 may be formed using the second organic layer 113, and may have a relatively large size. In such an embodiment, the wall structure 800 may be a relatively robust structure from an external impact or a stress in a manufacturing process. In such an embodiment, since a size of the second opening of the second barrier layer 114 is relatively increased, a photoresist used for forming the wall structure 800 may be readily removed. That is, the first TFE layer 451 and the third TFE layer 453 may be readily disposed within the groove 930 of the peripheral region 30. Accordingly, the OLED device 100 may effectively prevent or block water, moisture, etc., from being permeated into the semiconductor element 250 and the light emitting structure 300.

FIGS. 9 through 16 are cross-sectional views illustrating a method of manufacturing an OLED device in accordance with an exemplary embodiment.

Figure 9:
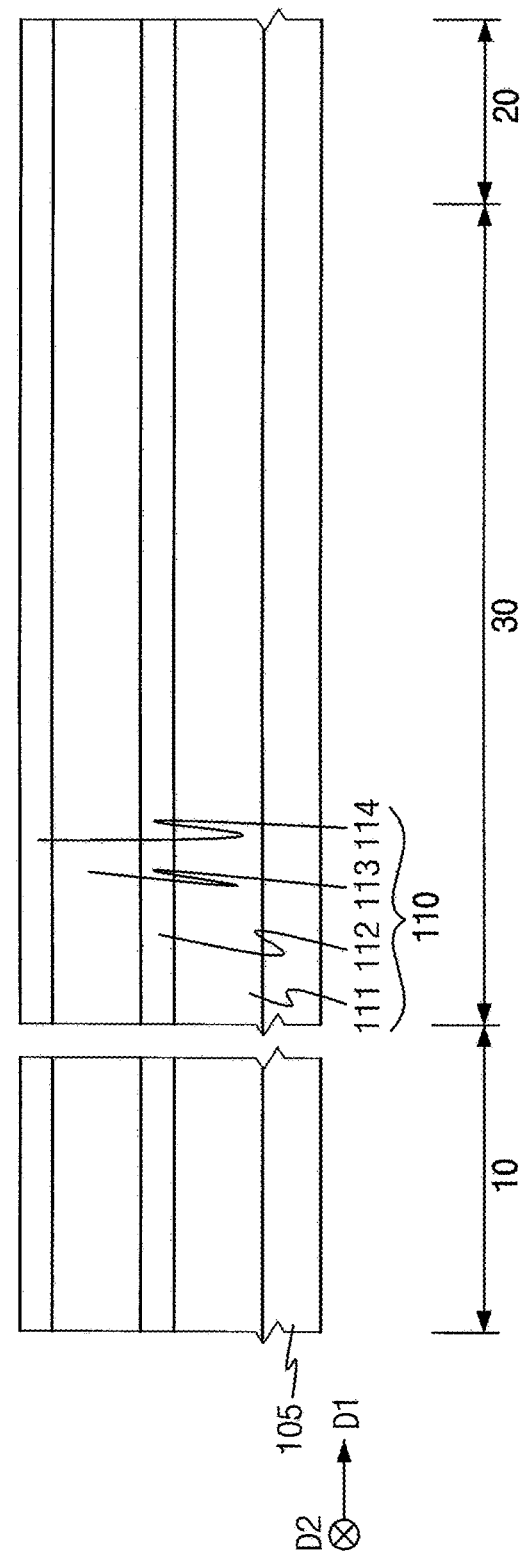
FIGS. 9 through 16 are cross-sectional views illustrating a method of manufacturing an OLED device in accordance with an exemplary embodiment.

Referring to FIG. 9, a rigid glass substrate 105 may be provided or prepared. A first organic layer 111 may be provided or formed on the rigid glass substrate 105. The first organic layer 111 may be formed on the entire rigid glass substrate 105, and may be formed using an organic material having flexibility such as polyimide.

A first barrier layer 112 may be provided or formed on the entire first organic layer 111. The first barrier layer 112 may block moisture or water that is permeated through the first organic layer 111. The first barrier layer 112 may be formed using an inorganic material having flexibility such as silicon oxide, silicon nitride, etc. In one exemplary embodiment, for example, the first barrier layer 112 may include SiO, SiN, SiON, SiOC, SiCN, AlO, AlN, TaO, HfO, ZrO, TiO or etc.

A second organic layer 113 may be provided or formed on the first barrier layer 112. The second organic layer 113 may be formed on the entire first barrier layer 112, and may be formed using an organic material having flexibility such as polyimide.

A second barrier layer 114 may be provided or formed on the entire second organic layer 113. The second barrier layer 114 may block moisture or water that is permeated through the second organic layer 113. The second barrier layer 114 may be formed using an inorganic material having flexibility such as SiO, SiN, etc.

Accordingly, a substrate 110 including the first organic layer 111, the first barrier layer 112, the second organic layer 113, and the second barrier layer 114 may be formed.

Since the substrate 110 is relatively thin and flexible, the substrate 110 may be formed on a rigid glass substrate 105 to help support the formation of an upper structure thereof (e.g., a semiconductor element and a light emitting structure, etc.). In one exemplary embodiment, for example, after the upper structure is formed on the substrate 110, the rigid glass substrate 105 may be removed. In other words, it may be difficult to directly form the upper structure on the first and second organic layers 111 and 113 and the first and second barrier layers 112 and 114 because the first and second organic layers 111 and 113 and the first and second barrier layers 112 and 114 are relatively thin and flexible. Accordingly, the upper structure is formed on the substrate 110 and the rigid glass substrate 105, and then the first and second organic layers 111 and 113 and the first and second barrier layers 112 and 114 may serve as the substrate 110 after the removal of the rigid glass substrate 105.

A buffer layer (not shown) may be provided or formed on the substrate 110 (e.g., the second barrier layer 114). The buffer layer may be formed on the entire substrate 110 except for the peripheral region 30. The buffer layer may effectively prevent the diffusion of metal atoms and/or impurities from the substrate 110. In addition, the buffer layer may control a rate of a heat transfer in a crystallization process for forming an active layer, thereby obtaining substantially uniform active layer. Further, the buffer layer may improve a surface flatness of the substrate 110 when a surface of the substrate 110 is relatively irregular. According to a type of the substrate 110, at least two buffer layers may be provided on the substrate 110, or the buffer layer may be omitted. In one exemplary embodiment, for example, the buffer layer may be formed using an organic material or an inorganic material.

Figure 10:
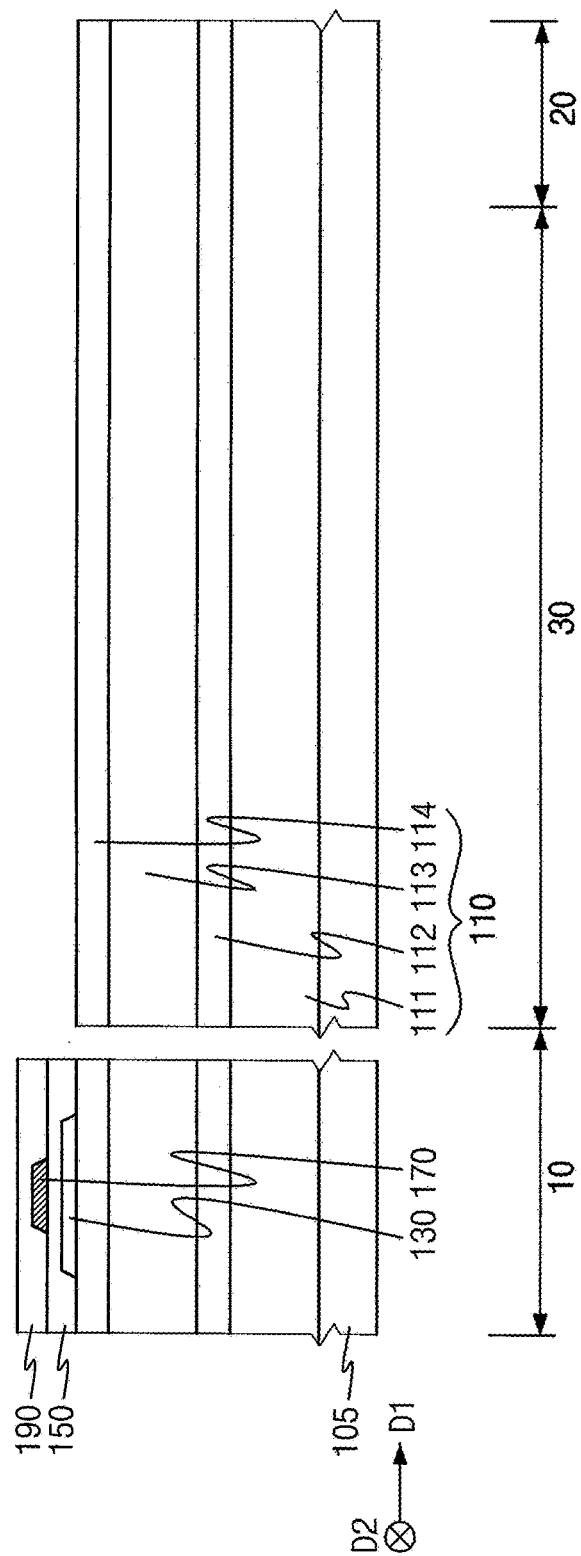

Referring to FIG. 10, an active layer 130 may be provided or formed in the display region 10 on the substrate 110. The active layer 130 may be formed using an oxide semiconductor, an inorganic semiconductor, an organic semiconductor or etc.

A gate insulation layer 150 may be provided or formed on the active layer 130. The gate insulation layer 150 may cover the active layer 130 in the display region 10 on the substrate 110, and may extend in the peripheral region 30. In one exemplary embodiment, for example, the gate insulation layer 150 may sufficiently cover the active layer 130 on the substrate 110, and may have a substantially flat upper surface without a step around the active layer 130. Alternatively, the gate insulation layer 150 may cover the active layer 130 on the substrate 110, and may be formed as a substantially uniform thickness along a profile of the active layer 130. The gate insulation layer 150 may be formed using silicon compound, metal oxide or etc. Alternatively, the gate insulation layer 150 may have a multi-layered structure including a plurality of insulation layers. In one exemplary embodiment, for example, the insulation layers may have different thicknesses from each other or include different materials from each other.

A gate electrode 170 may be provided or formed in the display region 10 on the gate insulation layer 150. The gate electrode 170 may be formed on a portion of the gate insulation layer 150 under which the active layer 130 is located. The gate electrode 170 may be formed using a metal, a metal alloy, a metal nitride, a conductive metal oxide, a transparent conductive material or etc. In one exemplary embodiment, for example, the gate electrode 170 may include Au, Ag, Al, Pt, Ni, Ti, Pd, Mg, Ca, Li, Cr, Ta, W, Cu, Mo, Sc, Nd, Ir, an alloy of aluminum, AlN, an alloy of silver, WN, an alloy of copper, an alloy of molybdenum, TiN, CrN, TaN, SRO, ZnO, ITO, SnO, InO, GaO, IZO or etc. Such materials may be used alone or in a suitable combination thereof. Alternatively, the gate electrode 170 may have a multi-layered structure including a plurality of layers.

An insulating interlayer 190 may be provided or formed on the gate electrode 170. The insulating interlayer 190 may cover the gate electrode 170 in the display region 10 on the gate insulation layer 150, and may extend in the peripheral region 30. That is, the insulating interlayer 190 may be formed on the entire gate insulation layer 150. In one exemplary embodiment, for example, the insulating interlayer 190 may sufficiently cover the gate electrode 170 on the gate insulation layer 150, and may have a substantially flat upper surface without a step around the gate electrode 170. Alternatively, the insulating interlayer 190 may cover the gate electrode 170 on the gate insulation layer 150, and may be formed as a substantially uniform thickness along a profile of the gate electrode 170. The insulating interlayer 190 may be formed using a silicon compound, a metal oxide, or etc. Alternatively, the insulating interlayer 190 may have a multi-layered structure including a plurality of insulation layers. The insulation layers may have different thicknesses from each other or include different materials from each other.

Figure 11:
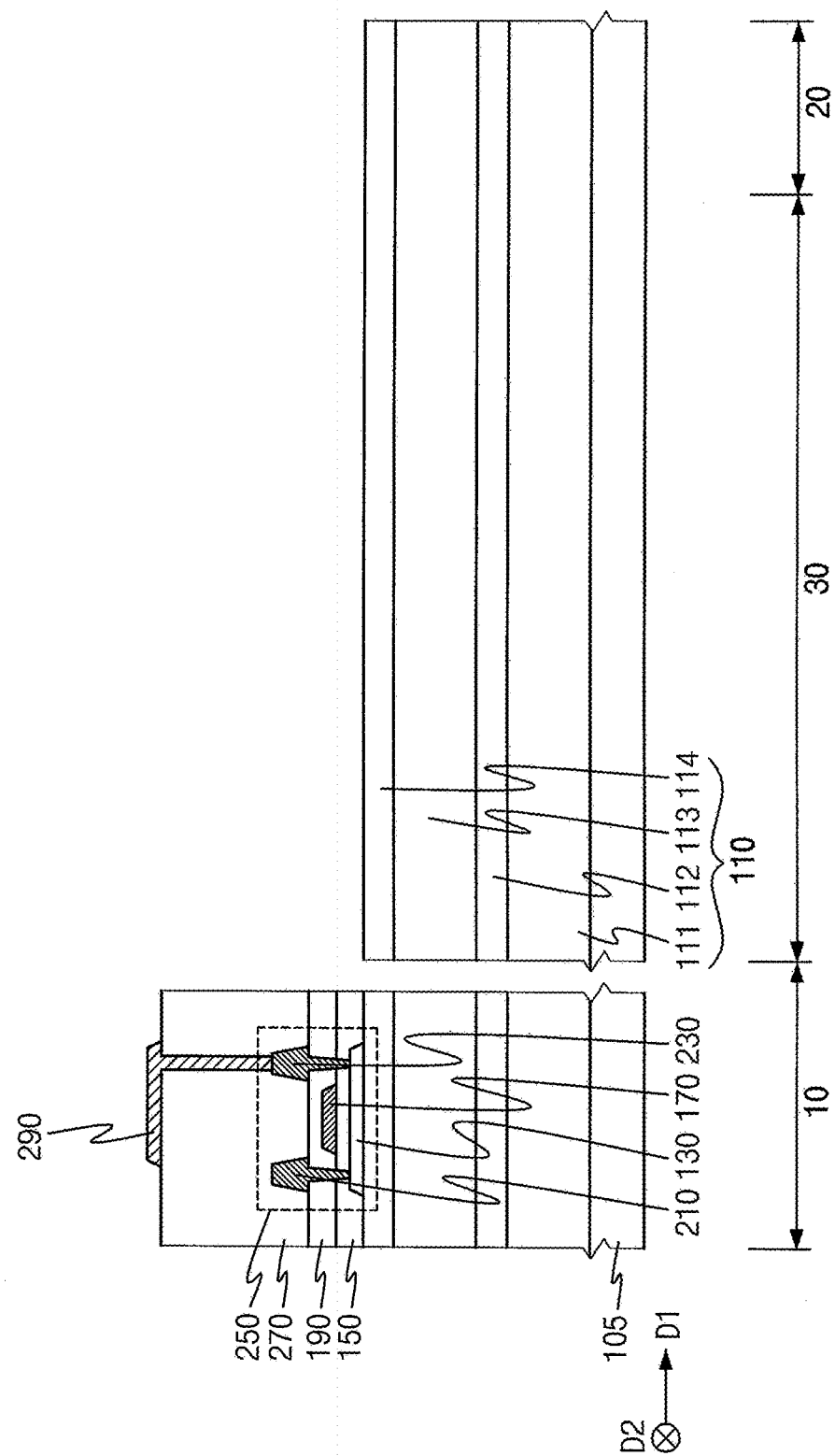

Referring to FIG. 11, a source electrode 210 and a drain electrode 230 may be provided or formed in the display region 10 on the insulating interlayer 190. The source electrode 210 may be connected to a source region of the active layer 130 via a contact hole formed by removing a first portion of the gate insulation layer 150 and the insulating interlayer 190. The drain electrode 230 may be connected to a drain region of the active layer 130 via a contact hole formed by removing a second portion of the gate insulation layer 150 and the insulating interlayer 190. Each of the source electrode 210 and the drain electrode 230 may include a metal, an alloy, a metal nitride, a conductive metal oxide, a transparent conductive material or etc. Such materials may be used alone or in a suitable combination thereof. In an exemplary embodiment, each of the source and drain electrodes 210 and 230 may have a multi-layered structure including a plurality of layers. Accordingly, a semiconductor element 250 including the active layer 130, the gate insulation layer 150, the gate electrode 170, the insulating interlayer 190, the source electrode 210 and the drain electrode 230 may be formed.

A planarization layer 270 may be provided or formed on the insulating interlayer 190, the source electrode 210 and the drain electrode 230. The planarization layer 270 may cover the source and drain electrodes 210 and 230 in the display region 10 on the insulating interlayer 190, and might not be formed in the peripheral region 30. That is, the planarization layer 270 may be formed only in the display region 10 on the insulating interlayer 190. In one exemplary embodiment, for example, the planarization layer 270 may be formed as a high thickness in the display region 10. In such an embodiment, the planarization layer 270 may have a substantially flat upper surface, and a planarization process may be further performed on the planarization layer 270 to implement the flat upper surface of the planarization layer 270. Alternatively, the planarization layer 270 may be formed as a substantially uniform thickness along a profile of the source and drain electrodes 210 and 230 in the display region 10 on the insulating interlayer 190. The planarization layer 270 may include an organic material or an inorganic material. In an exemplary embodiment, the planarization layer 270 may be formed using an organic material.

A lower electrode 290 may be provided or formed in the display region 10 on the planarization layer 270. The lower electrode 290 may be connected to the drain electrode 230 via a contact hole formed by removing a portion of the planarization layer 270. In addition, the lower electrode 290 may be electrically connected to the semiconductor element 250. The lower electrode 290 may be formed using a metal, a metal alloy, a metal nitride, a conductive metal oxide, a transparent conductive material or etc. Such materials may be used alone or in a suitable combination thereof. In an exemplary embodiment, the lower electrode 290 may have a multi-layered structure including a plurality of layers.

After the lower electrode 290 is formed, the gate insulation layer 150 and the insulating interlayer 190 that are located in the peripheral region 30 may be removed. After the gate insulation layer 150 and the insulating interlayer 190 that are located in the peripheral region 30 are removed, a photoresist formed using a half tone mask may be formed in the peripheral region 30.

Figure 12:
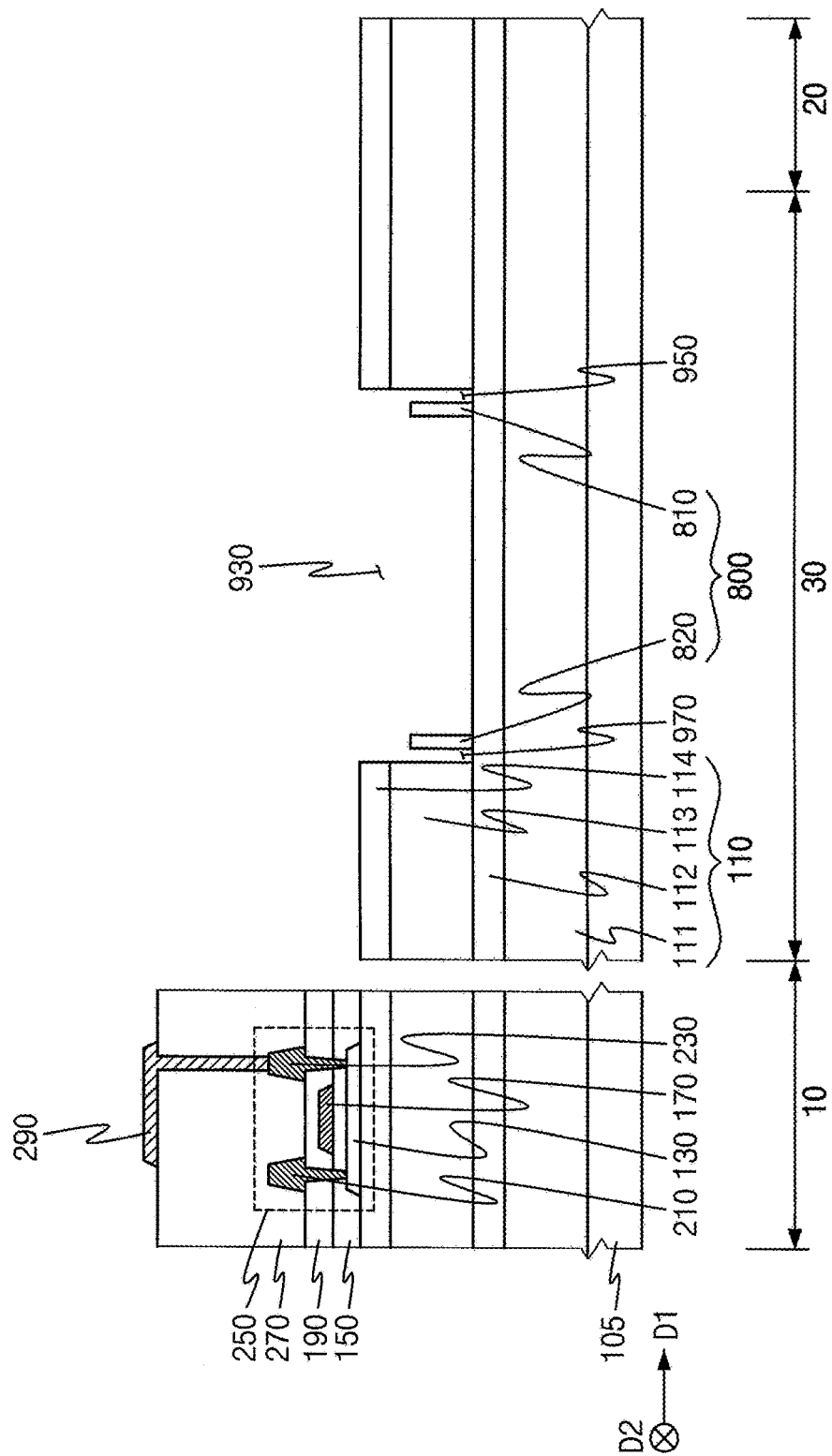

Referring to FIG. 12, a groove 930 may be formed in a portion of the peripheral region 30 of the substrate 110 using the photoresist, and a wall structure 800 may be formed within the groove 930. In one exemplary embodiment, for example, the groove 930 may be defined by a first opening of the second organic layer 113 and a second opening of the second barrier layer 114. In an exemplary embodiment, the groove 930 and the wall structure 800 may be simultaneously (or concurrently) formed. In one exemplary embodiment, for example, the wall structure 800 may be formed along a profile of an outer portion of an opening region 20 (refer to FIG. 5). The groove 930 may include a first side wall 931 located adjacent to the opening region 20 and a second side wall 932 located opposite to the first side wall 931 (refer to FIG. 8). The wall structure 800 may include the first wall pattern 810 and the second wall pattern 820. Each of the first wall pattern 810 and the second wall pattern 820 may have a plan shape of a hollow circle. The first wall pattern 810 may be spaced apart from the first side wall 931 by a first distance dl, and may substantially surround the first side wall 931. Here, a space where the first wall pattern 810 is spaced apart from the first side wall 931 by the first distance dl may define a first space 950. The second wall pattern 820 may be spaced apart from the second side wall 932 by the first distance dl, and may substantially surround the first wall pattern 810. Here, a space where the second wall pattern 820 is spaced apart from the second side wall 932 by the first distance dl may define a second space 970. An upper surface of the wall structure 800 may be located lower than an upper surface of the substrate 110 (or an upper surface of the second organic layer 113). The wall structure 800 may have a first height H1 from an upper surface of the first barrier layer 112 to an upper surface of the wall structure 800, and the second organic layer 113 may have a second height H2 from an upper surface of the first barrier layer 112 to an upper surface of the second organic layer 113. The first height H1 may be less than the second height H2. In other words, a shape of the photoresist may be determined such that the wall structure 800 has the first height H1. The wall structure 800 may include an inorganic material or an organic material. In an exemplary embodiment, the wall structure 800 may be formed using an organic material. In one exemplary embodiment, for example, the wall structure 800 may include a photoresist, a polyacryl-based resin, a polyimide-based resin, a polyamide-based resin, a siloxane-based resin, an acryl-based resin, an epoxy-based resin or etc.

Figure 13A:
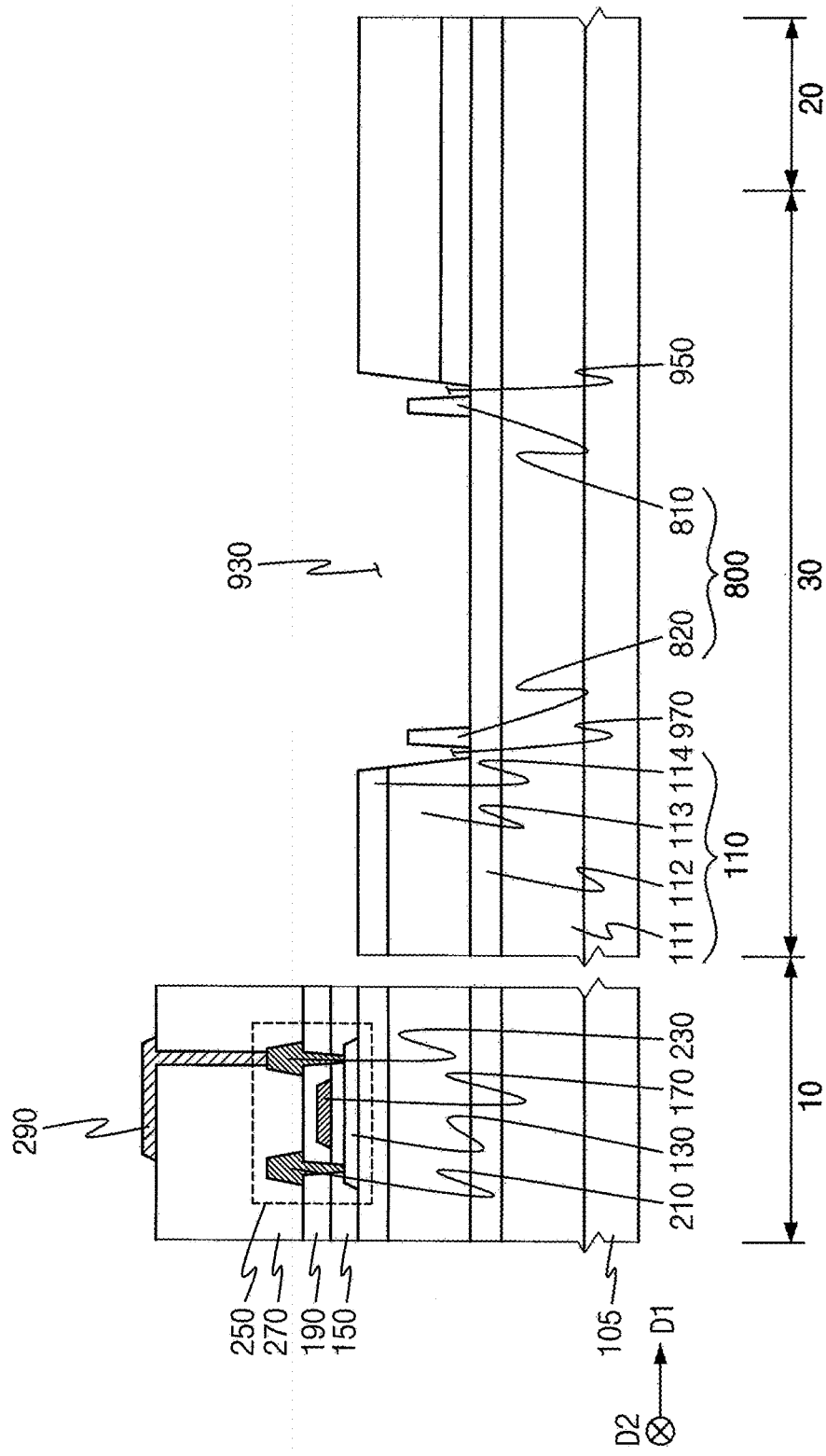
Figure 13B:
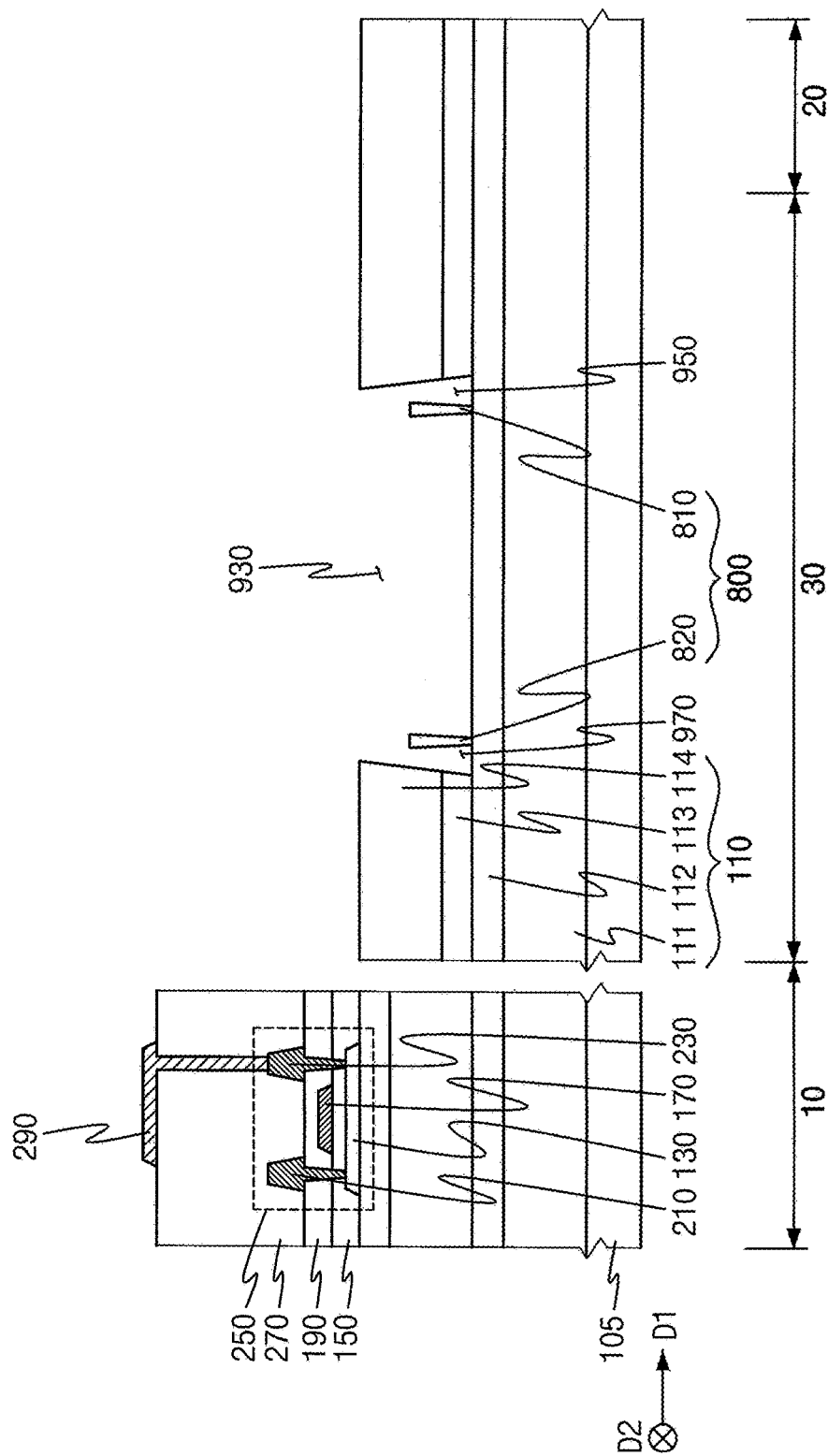

In an exemplary embodiment, as illustrated in FIGS. 13A and 13B, a shape of the wall structure 800 may be determined according to a type of the photoresist. In such an embodiment, the wall structure 800 of FIG. 13A may be formed using a positive photoresist, or the wall structure 800 of FIG. 13B may be formed using a negative photoresist. In an exemplary embodiment, as shown in FIG. 13B, the groove 930 may have an opening having an enlarged lower portion (e.g., a shape of an under-cut). In such an embodiment, a light emitting layer, an upper electrode, a capping layer, etc., which will be described below, may be readily separated in the first space 950 and the second space 970. Accordingly, a permeability path of water and/or moisture, etc., may be blocked.

Figure 14:
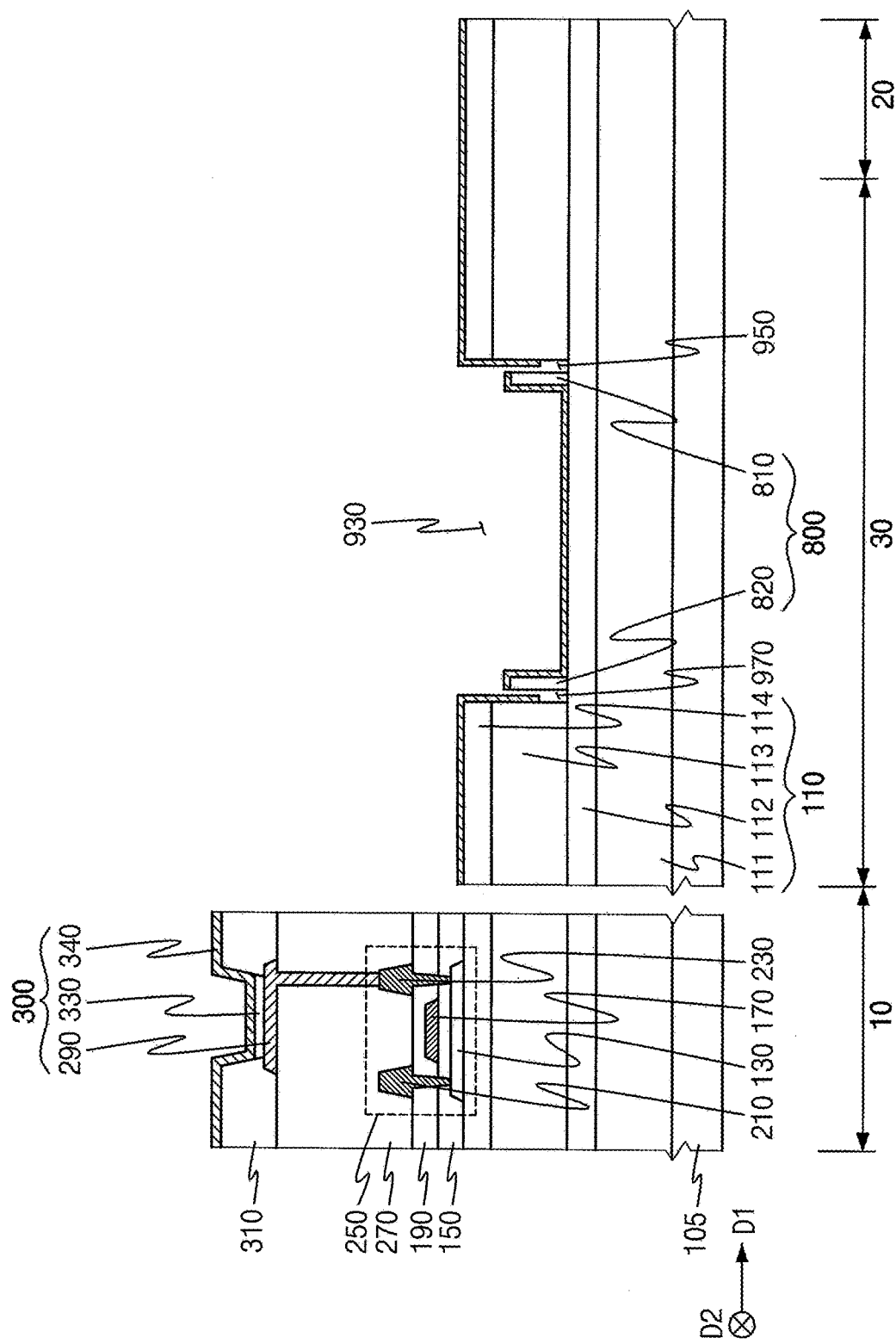

Referring to FIG. 14, a pixel defining layer 310 may be provided or formed in the display region 10 on the planarization layer 270, but may not be formed in the peripheral region 30. That is, the pixel defining layer 310 may be formed only in the display region 10. In one exemplary embodiment, for example, the pixel defining layer 310 may cover both lateral portions of the lower electrode 290, and may expose a portion of an upper surface of the lower electrode 290. The pixel defining layer 310 may include an organic material or an inorganic material. In an exemplary embodiment, the pixel defining layer 310 may be formed using an organic material.

A light emitting layer 330 may be provided or formed on a portion of the lower electrode 290 exposed by the pixel defining layer 310 in the display region 10. The light emitting layer 330 may be formed using at least one of light emitting materials capable of generating different colors of light (e.g., a red color of light, a blue color of light, and a green color of light, etc.) according to sub-pixels. Alternatively, the light emitting layer 330 may generally generate a white color of light by stacking a plurality of light emitting materials capable of generating different colors of light such as a red color of light, a green color of light, a blue color of light, etc. In such an embodiment, a color filter may be formed on the light emitting layer 330. The color filter may include a red color filter, a green color filter and a blue color filter. Alternatively, the color filter may include a yellow color filter, a cyan color filter and a magenta color filter. The color filter may be formed using a photosensitive resin, a color photoresist or etc.

In an alternative exemplary embodiment, the light emitting layer 330 may be further provided or formed in the peripheral region 30. In such an embodiment, because of the first wall pattern 810 spaced apart from the first side wall 931 and the second wall pattern 820 spaced apart from the second side wall 932, the light emitting layer 330 may be separated in the first space 950 and the second space 970. That is, as the light emitting layer 330 is separated in the first space 950 and the second space 970, a permeability path of the light emitting layer 330 may be blocked. Accordingly, although the light emitting layer 330 is formed in the peripheral region 30, a defect of a pixel included in an OLED device might not occur.

An upper electrode 340 may be provided or formed in the display region 10 and a portion of the peripheral region 30 on the pixel defining layer 310 and the light emitting layer 330. In an exemplary embodiment, the upper electrode 340 may extend in a first direction D1 from the display region 10 into the peripheral region 30, and may be partially formed in the peripheral region 30. In one exemplary embodiment, for example, the upper electrode 340 may be separated in the first space 950 where the first wall pattern 810 is spaced apart from the first side wall of the second organic layer 113 (e.g., the first side wall 931) defined by the first opening of the second organic layer 113, and may be separated in the second space 970 where the second wall pattern 820 is spaced apart from the second side wall of the second organic layer 113 (e.g., second side wall 932) defined by the first opening of the second organic layer 113. In such an embodiment, the upper electrode 340 within the groove 930 may be formed on both lateral side surfaces of the second barrier layer 114, at least a portion of both lateral side surfaces of the second organic layer 113 each, at least a portion of an upper surface of the wall structure 800, inner side surfaces, which is not opposite to both lateral side surfaces of the second organic layer 113, of the wall structure 800 (e.g., side surfaces facing the first wall pattern 810 and the second wall pattern 820), and the first barrier layer 112. The upper electrode 340 may be formed using a metal, a metal alloy, a metal nitride, a conductive metal oxide, a transparent conductive material or etc. These may be used alone or in a suitable combination thereof. In an exemplary embodiment, the upper electrode 340 may have a multi-layered structure including a plurality of layers. Accordingly, a light emitting structure 300 including the lower electrode 290, the light emitting layer 330, and the upper electrode 340 may be formed.

A capping layer (not shown) may be provided or formed on the upper electrode 340. That is, the capping layer may be formed in the peripheral region 30. In such an embodiment, because of the first wall pattern 810 spaced apart from the first side wall 931 and the second wall pattern 820 spaced apart from the second side wall 932, the capping layer may be separated in the first space 950 and the second space 970. That is, as the capping layer is separated in the first space 950 and the second space 970, a permeability path of the capping layer may be blocked. Accordingly, although capping layer is formed in the peripheral region 30, a defect of a pixel included in an OLED device might not occur. The capping layer may protect the light emitting structure 300, and may include organic materials or inorganic materials. In one exemplary embodiment, for example, the capping layer may be formed using a triamine derivative, arylenediamine derivative, CBP, Alq3 or etc.

Figure 15:
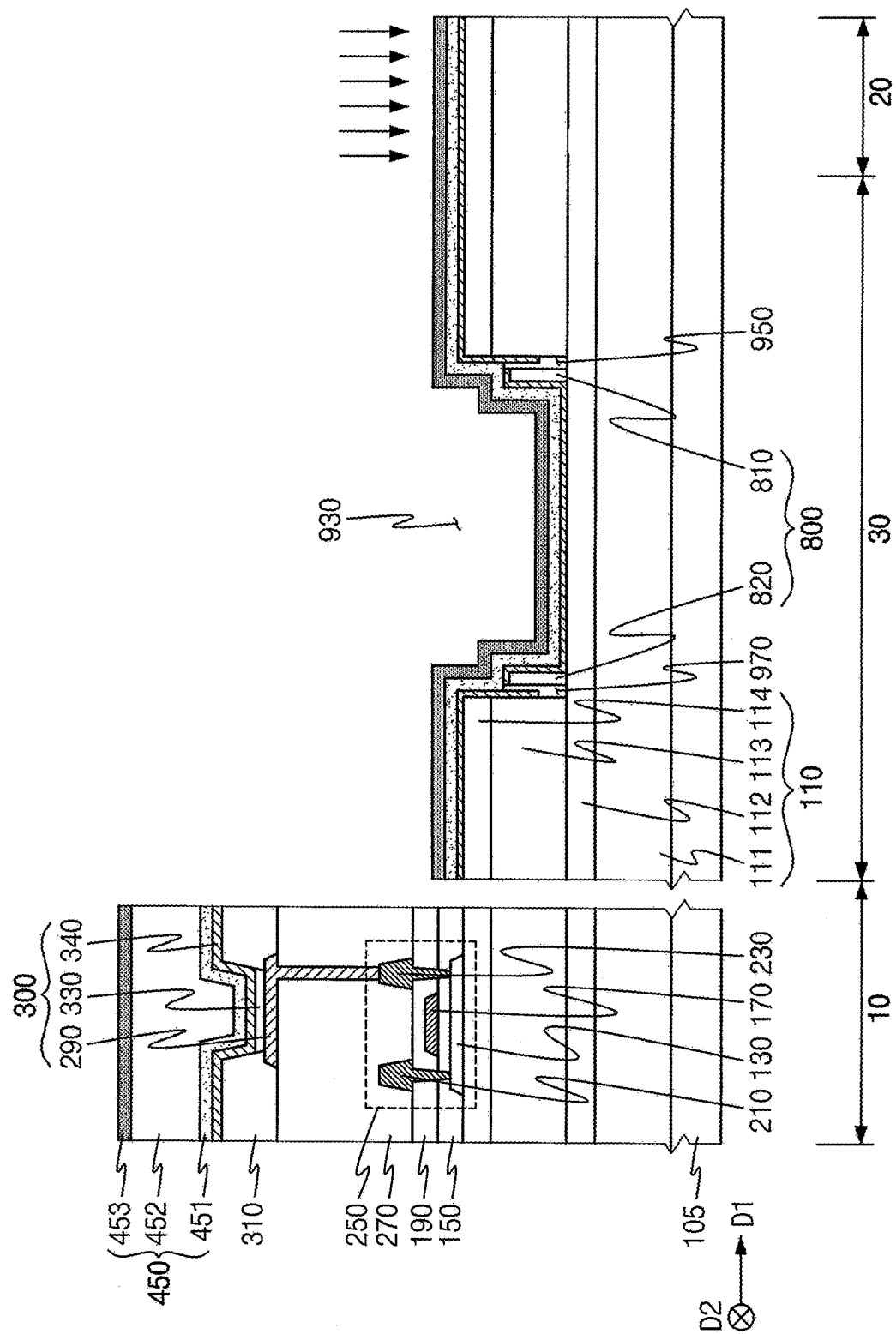

Referring to FIG. 15, a first TFE layer 451 may be provided or formed in the display region 10 and the peripheral region 30 on the upper electrode 340. The first TFE layer 451 may cover the upper electrode 340 in the display region 10, and may be formed as a substantially uniform thickness along a profile of the upper electrode 340, and may extend in the peripheral region 30. The first TFE layer 451 may be formed along a profile of the upper electrode 340 in the peripheral region 30. The first TFE layer 451 may effectively prevent the light emitting structure 300 from being deteriorated by the permeation of moisture, water, oxygen, etc. In such an embodiment, the first TFE layer 451 may protect the light emitting structure 300 from external impacts. The first TFE layer 451 may be formed using an inorganic material having flexibility.

A second TFE layer 452 may be provided or formed in the display region 10 on the first TFE layer 451, and might not be formed in the peripheral region 30. That is, the second TFE layer 452 may be formed only in the display region 10. The second TFE layer 452 may improve the flatness of a display panel, and may protect the light emitting structure 300. The second TFE layer 452 may be formed using an organic material having flexibility.

A third TFE layer 453 may be provided or formed in the display region 10 and the peripheral region 30 on the second TFE layer 452. The third TFE layer 453 may cover the second TFE layer 452 in the display region 10 and be formed as a substantially uniform thickness along a profile of the second TFE layer 452, and may extend in the peripheral region 30. The third TFE layer 453 may cover the first TFE layer 451 in the peripheral region 30, and may be formed as a substantially uniform thickness along a profile of the first TFE layer 451. The third TFE layer 453 together with the first TFE layer 451 may prevent the light emitting structure 300 from being deteriorated by the permeation of moisture, water, oxygen, etc. In addition, the third TFE layer 453 together with the first and second TFE layers 451 and 452 may protect the light emitting structure 300 from external impacts. The third TFE layer 453 may be formed using an inorganic material having flexibility. Accordingly, a TFE structure 450 including the first TFE layer 451, the second TFE layer 452, and the third TFE layer 453 may be formed. Alternatively, the TFE structure 450 may have five layers structure where first to fifth TFE layers are stacked one on another or seven layers structure where first to seventh TFE layers are stacked one on another.

After the TFE structure 450 is formed, a laser may be irradiated in the opening region 20 on the TFE structure 450. Alternatively, a different etching process may be performed to expose the opening region 20 on the TFE structure 450.

Accordingly, a display panel 200 including the substrate 110, the semiconductor element 250, the planarization layer 270, the light emitting structure 300, the pixel defining layer 310, the TFE structure 450, and the wall structure 800 may be formed.

Figure 16:
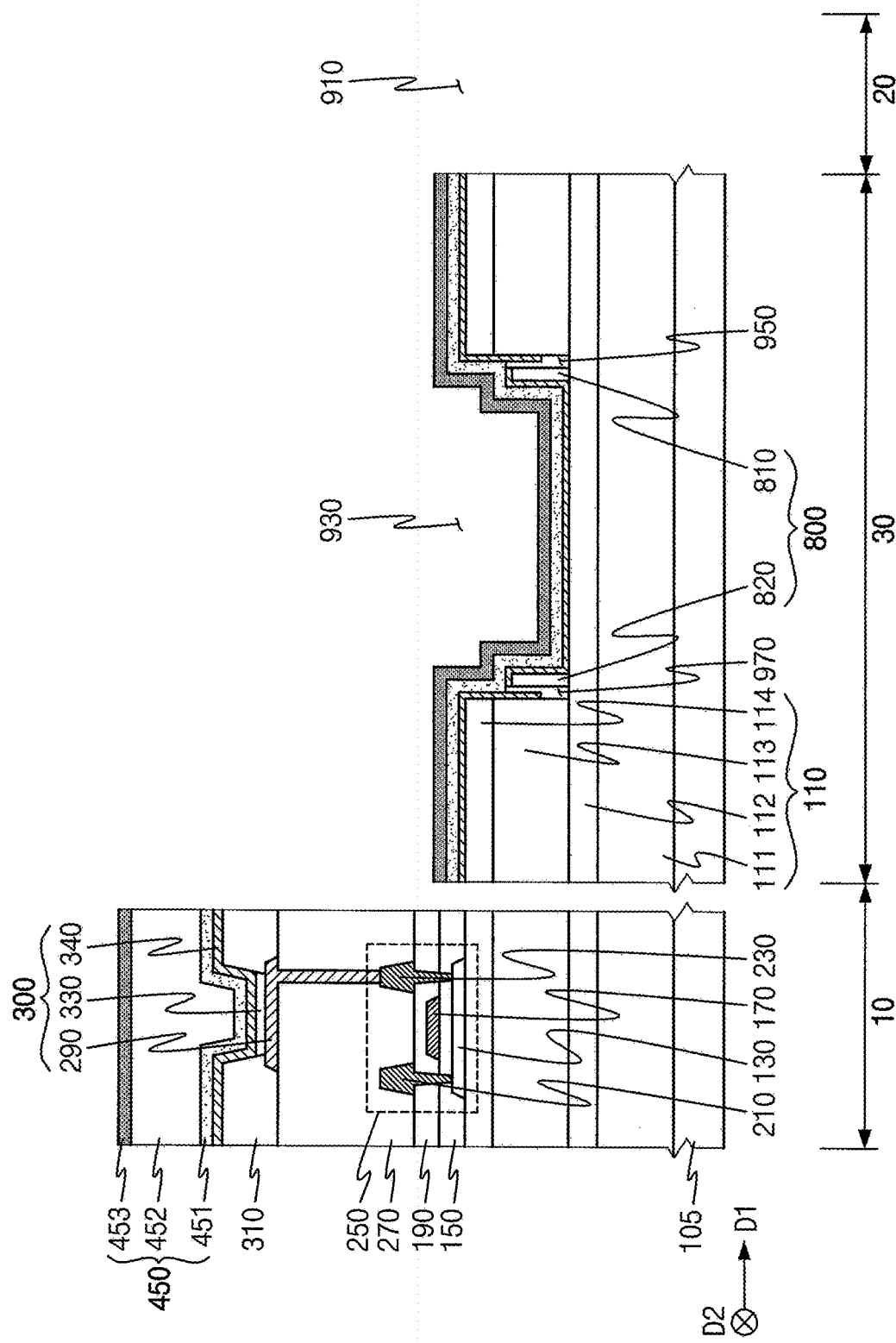

Referring to FIGS. 16 and 6, an opening 910 may be formed in the opening region 20 through the laser irradiation, and the optical module 700 may be provided or disposed in the opening 910. In one exemplary embodiment, for example, the optical module 700 may include a camera module for capturing (or recognizing) an image of an object, a face recognition sensor module for sensing a face of a user, a pupil recognition sensor module for sensing a pupil of a user, acceleration and geomagnetic sensor modules for determining movement of an OLED device, proximity and infrared sensor modules for detecting proximity to an OLED device or and a light intensity sensor module for measuring the degree of brightness when left in a pocket or a bag, for example. After the optical module 700 is provided, the rigid glass substrate 105 may be removed from the substrate 110. Accordingly, an OLED device 100 illustrated in FIG. 6 may be manufactured.

Figure 17:
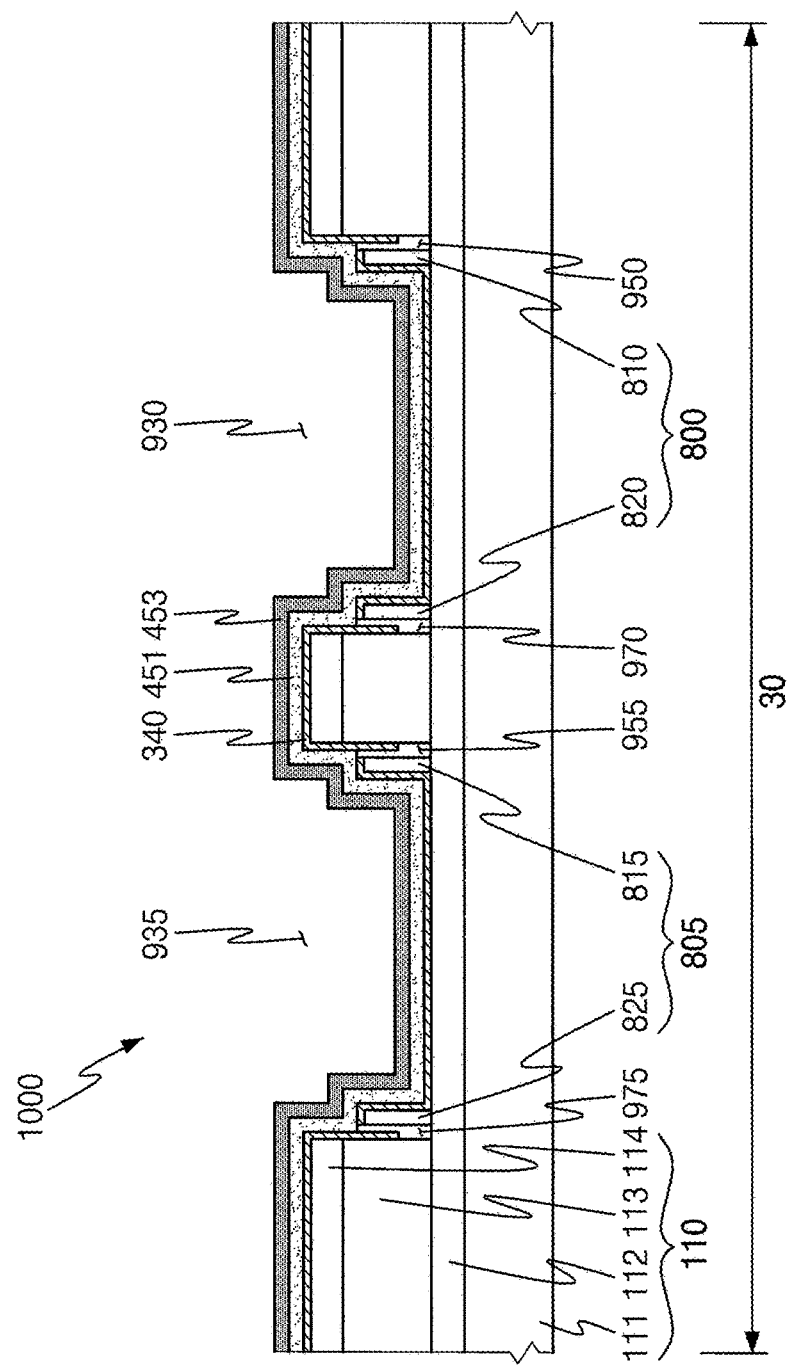
FIG. 17 is a cross-sectional view illustrating an OLED device in accordance with an alternative exemplary embodiment.

FIG. 17 is a cross-sectional view illustrating an OLED device in accordance with an alternative exemplary embodiment. An embodiment of the OLED device 1000 illustrated in FIG. 17 may have a configuration substantially the same as or similar to that of embodiments of the OLED device 100 described with reference to FIGS. 1 through 8 except for a second groove 935 and a second wall structure 805. The same or like elements shown in FIG. 17 have been labeled with the same reference characters as used above to describe the embodiments with reference to FIGS. 1 through 8 and any repetitive detailed descriptions thereof will be omitted or simplified.

Referring to FIG. 17, an exemplary embodiment of an OLED device 1000 may include a display panel 200, an optical module 700 and etc. The display panel 200 may include a substrate 110, a semiconductor element 250, a planarization layer 270, a light emitting structure 300, a pixel defining layer 310, a TFE structure 450, a first wall structure 800, a second wall structure 805, etc. In such an embodiment, the substrate 110 may include a first organic layer 111, a first barrier layer 112, a second organic layer 113, and a second barrier layer 114. As the display panel 200 has the display region 10, the opening region 20 and the peripheral region 30, the substrate 110 may be divided into the display region 10, the opening region 20, and the peripheral region 30. The light emitting structure 300 may include a lower electrode 290, a light emitting layer 330, and an upper electrode 340, and the TFE structure 450 may include a first TFE layer 451, a second TFE layer 452, and a third TFE layer 453. The first wall structure 800 may include a first wall pattern 810 and a second wall pattern 820, and the second wall structure 805 may include a third wall pattern 815 and a fourth wall pattern 825.

In an exemplary embodiment, the display panel 200 may further include a first groove 930 and a second groove 935 that are formed in the peripheral region 30. In such an embodiment, the first wall structure 800 may be disposed within the first groove 930, and the second wall structure 805 may be disposed within the second groove 935. Accordingly, as the OLED device 1000 includes the first and second wall structures 800 and 805, the OLED device 1000 may effectively prevent or block water, moisture, etc., from being penetrated into the semiconductor element 250 and the light emitting structure 300.

The first wall structure 800 may be disposed in a first portion of the peripheral region 30 on the first barrier layer 112. The first wall structure 800 may be disposed along a profile of an outer portion of the opening region 20. That is, the first wall structure 800 may surround the optical module 700. In such an embodiment, the first wall structure 800 may be disposed within the first groove 930 of the substrate 110. Here, the first groove 930 may include a first side wall 931 located adjacent to the opening region 20 and a second side wall 932 located opposite to the first side wall 931 (refer to FIG. 8).

In an exemplary embodiment, the second wall structure 805 may be disposed in a second portion of the peripheral region 30 on the first barrier layer 112. The second wall structure 805 may be disposed along a profile of an outer portion of the first wall structure 800. That is, the second wall structure 805 may surround the first wall structure 800. In such an embodiment, the second wall structure 805 may be disposed within the second groove 935 of the substrate 110. Here, the second groove 935 may include a third side wall located adjacent to the second side wall 932 and a fourth side wall located opposite to the third side wall.

The first wall structure 800 may include the first wall pattern 810 and the second wall pattern 820. Each of the first wall pattern 810 and the second wall pattern 820 may have a plan shape of a hollow circle. The first wall pattern 810 may be spaced apart from the first side wall 931 by a first distance dl, and may substantially surround the first side wall 931. Here, a space where the first wall pattern 810 is spaced apart from the first side wall 931 by the first distance dl may define as a first space 950. The second wall pattern 820 may be spaced apart from the second side wall 932 by the first distance dl, and may substantially surround the first wall pattern 810. Here, a space where the second wall pattern 820 is spaced apart from the second side wall 932 by the first distance dl may define a second space 970. In one exemplary embodiment, for example, the first distance dl where the first wall pattern 810 is spaced apart from the first side wall 931 may be substantially identical to a distance where the second wall pattern 820 is spaced apart from the second side wall 932, and the first distance dl may be greater than a thickness of the upper electrode 340. In such an embodiment, a diameter of the second wall pattern 820 may be greater than a diameter of the first wall pattern 810. Further, an upper surface of the first wall structure 800 may be located lower than an upper surface of the substrate 110 (or an upper surface of the second organic layer 113). The first wall structure 800 may have a first height H1 from an upper surface of the first barrier layer 112 to an upper surface of the first wall structure 800, and the second organic layer 113 may have a second height H2 from an upper surface of the first barrier layer 112 to an upper surface of the second organic layer 113. The first height H1 may be less than the second height H2.

In an exemplary embodiment, the second wall structure 805 may include the third wall pattern 815 and the fourth wall pattern 825. Each of the third wall pattern 815 and the fourth wall pattern 825 may have a plan shape of a hollow circle. The third wall pattern 815 may be spaced apart from the third side wall by a second distance, and may substantially surround the third side wall. Here, a space where the third wall pattern 815 is spaced apart from the third side wall by the second distance may define a third space 955. The fourth wall pattern 825 may be spaced apart from the fourth side wall by the second distance, and may substantially surround the third wall pattern 815. Here, a space where the fourth wall pattern 825 is spaced apart from the fourth side wall by the second distance may define a fourth space 975. In one exemplary embodiment, for example, the second distance where the third wall pattern 815 is spaced apart from the third side wall may be substantially identical to a distance where the fourth wall pattern 825 is spaced apart from the fourth side wall, and the second distance may be greater than a thickness of the upper electrode 340. In an exemplary embodiment, the second distance may be identical to the first distance dl. Alternatively, the second distance may be less or greater than the first distance dl. In addition, a diameter of the third wall pattern 815 may be greater than a diameter of the fourth wall pattern 825. Further, an upper surface of the second wall structure 805 may be located lower than an upper surface of the substrate 110 (or an upper surface of the second organic layer 113). The second wall structure 805 may have a first height H1 from an upper surface of the first barrier layer 112 to an upper surface of the second wall structure 805, and the second organic layer 113 may have a second height H2 from an upper surface of the first barrier layer 112 to an upper surface of the second organic layer 113. The first height H1 may be less than the second height H2.

Each of the first and second wall structures 800 and 805 may include an inorganic material or an organic material. In an exemplary embodiment, each of the first and second wall structures 800 and 805 may include organic materials. In one exemplary embodiment, for example, the first and second wall structures 800 and 805 may be simultaneously formed using a same material.

An exemplary embodiment of the OLED device 1000 includes the first and second wall structures 800 and 805 disposed within the first and second grooves 930 and 935, respectively. Accordingly, the OLED device 1000 may effectively prevent or block water, moisture, etc., from being permeated into the semiconductor element 250 and the light emitting structure 300.

The invention may be applied to various display devices including an OLED device, e.g., vehicle-display device, a ship-display device, an aircraft-display device, portable communication devices, display devices for display or for information transfer, a medical-display device, etc.

The foregoing is illustrative of an exemplary embodiment and is not to be construed as limiting thereof. Although some exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiment disclosed, and that modifications to the disclosed exemplary embodiments, as well as other exemplary embodiments, are intended to be included within the scope of the appended claims.

What is claimed is:

1. An organic light emitting display device, comprising:
   a display panel including:
   a substrate having an opening region, a peripheral region surrounding the opening region, and a display region surrounding the peripheral region, wherein a first groove is defined in the peripheral region and an opening is defined in the opening region;
   a light emitting structure in the display region on a top surface of the substrate; and
   a first wall structure within the first groove of the substrate; and
   an optical module overlapping the opening,
   wherein the first groove is formed in the substrate, and the substrate includes at least three layers, and
   wherein side surfaces of two of the at least three layers of the substrate are aligned with each other in a direction perpendicular to the top surface of the substrate, and the side surfaces are located within the peripheral region adjacent to the opening.

2. The organic light emitting display device of claim 1, wherein the first groove includes:
   a first side wall located adjacent to the opening region; and
   a second side wall opposite to the first side wall, and
   wherein the first wall structure includes:
   a first wall pattern spaced apart from the first side wall, wherein the first wall pattern surrounds the first side wall; and
   a second wall pattern spaced apart from the second side wall,
   wherein the second wall pattern surrounds the first wall pattern.

3. The organic light emitting display device of claim 2, wherein a distance of the first wall pattern from the first side wall is identical to a distance of the second wall pattern from the second side wall.

4. The organic light emitting display device of claim 1, wherein the substrate includes:
   a first organic layer;
   a first barrier layer disposed on the first organic layer;
   a second organic layer disposed on the first barrier layer, wherein a first opening is defined through the second organic layer in the peripheral region; and
   a second barrier layer disposed on the second organic layer,
   wherein a second opening overlapping the first opening is defined through the second barrier layer.

5. The organic light emitting display device of claim 4, wherein the light emitting structure includes:
   a lower electrode;
   a light emitting layer disposed on the lower electrode; and
   an upper electrode disposed on the light emitting layer.

6. The organic light emitting display device of claim 5, wherein the upper electrode extends from the display region to the peripheral region, and is partially disposed in the peripheral region.

7. The organic light emitting display device of claim 5, wherein the upper electrode is separated in a space between the first wall structure and a side wall of the second organic layer defined by the first opening.

8. The organic light emitting display device of claim 5, wherein the upper electrode within the first groove is disposed on at least a portion of a side surface of the second organic layer, at least a portion of an upper surface of the first wall structure, a side surface, which is not opposite to the side surface of the second organic layer, of the first wall structure, and the first barrier layer.

9. The organic light emitting display device of claim 5, wherein
   the first wall structure has a first height from an upper surface of the first barrier layer to an upper surface of the first wall structure,
   the second organic layer has a second height from the upper surface of the first barrier layer to an upper surface of the second organic layer, and
   the first height is less than the second height.

10. The organic light emitting display device of claim 5, wherein
    the first wall structure is disposed on the first barrier layer, and is spaced apart from a side wall of the second organic layer defined by the first opening, and
    wherein a distance of the first wall structure from the second organic layer is defined as a first distance.

11. The organic light emitting display device of claim 10, wherein the first distance is greater than a thickness of the upper electrode.

12. The organic light emitting display device of claim 5, further comprising:
- a thin film encapsulation structure disposed on the light emitting structure,
- wherein the thin film encapsulation structure includes:
  - a first thin film encapsulation layer disposed on the upper electrode, the first thin film encapsulation layer including an inorganic material having flexibility;
  - a second thin film encapsulation layer disposed on the first thin film encapsulation layer, the second thin film encapsulation layer including an organic material having flexibility; and
  - a third thin film encapsulation layer disposed on the second thin film encapsulation layer, the third thin film encapsulation layer including an inorganic material having flexibility.

13. The organic light emitting display device of claim 12, wherein the first thin film encapsulation layer and the third thin film encapsulation layer extend in a direction from the display region to the peripheral region, and are disposed in the peripheral region.

14. The organic light emitting display device of claim 13, wherein the first thin film encapsulation layer is continuously disposed in a space between the first wall structure and a side wall of the second organic layer defined by the first opening.

15. The organic light emitting display device of claim 14, wherein the first thin film encapsulation layer is disposed inside a space between the first wall structure and the side wall of the second organic layer.

16. The organic light emitting display device of claim 14, wherein the optical module is in contact with a side surface of the substrate, a side surface of the upper electrode, a side surface of the first thin film encapsulation layer, and a side surface of the third thin film encapsulation layer in a boundary of the peripheral region and the opening region.

17. The organic light emitting display device of claim 1, wherein the substrate further includes:
- a second groove surrounding the first groove,
  - wherein the second groove is defined in the peripheral region.

18. The organic light emitting display device of claim 17, wherein the display panel further includes:
- a second wall structure disposed within the second groove of the substrate.

19. An organic light emitting display device, comprising:
a display panel including:
- a substrate having an opening region, a peripheral region surrounding the opening region, and a display region surrounding the peripheral region, wherein a first groove is defined in the peripheral region and an opening is defined in the opening region;
- a light emitting structure in the display region on the substrate; and
- a first wall structure within the first groove of the substrate; and
an optical module overlapping the opening,
wherein an upper surface of the first wall structure is lower than an upper surface of the substrate.

20. An organic light emitting display device, comprising:
a display panel including:
- a substrate having an opening region, a peripheral region surrounding the opening region, and a display region surrounding the peripheral region, wherein a first groove is defined in the peripheral region and an opening is defined in the opening region;
- a light emitting structure in the display region on the substrate; and
- a first wall structure within the first groove of the substrate; and
an optical module overlapping the opening,
wherein the substrate includes:
- a first organic layer;
- a first barrier layer disposed on the first organic layer;
- a second organic layer disposed on the first barrier layer, wherein a first opening is defined through the second organic layer in the peripheral region; and
- a second barrier layer disposed on the second organic layer, wherein a second opening overlapping the first opening is defined through the second barrier layer, and
wherein the first opening and the second opening collectively define the first groove of the substrate.

* * * * *